United States Patent
Ahn et al.

(10) Patent No.: US 7,776,762 B2
(45) Date of Patent: Aug. 17, 2010

(54) ZIRCONIUM-DOPED TANTALUM OXIDE FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 612 days.

(21) Appl. No.: 11/608,281

(22) Filed: Dec. 8, 2006

(65) Prior Publication Data

US 2007/0087563 A1    Apr. 19, 2007

Related U.S. Application Data

(62) Division of application No. 10/909,959, filed on Aug. 2, 2004, now Pat. No. 7,601,649.

(51) Int. Cl.
    H01L 21/8242    (2006.01)
    H01L 21/31    (2006.01)
    H01L 21/469    (2006.01)

(52) U.S. Cl. .................. 438/778; 438/783; 438/785; 438/240

(58) Field of Classification Search .................. 438/778, 438/439, 216, 591, 685, 785, 240, 3, 783, 438/784
See application file for complete search history.

(56) References Cited

U.S. PATENT DOCUMENTS

| | | |
|---|---|---|
| 5,049,516 A | 9/1991 | Arima |
| 5,084,606 A | 1/1992 | Bailey et al. |
| 5,426,603 A | 6/1995 | Nakamura et al. |
| 5,439,524 A | 8/1995 | Cain et al. |
| 5,478,653 A | 12/1995 | Guenzer |
| 5,572,052 A | 11/1996 | Kashihara et al. |
| 5,674,563 A | 10/1997 | Tarui et al. |
| 5,739,524 A | 4/1998 | Fally |
| 5,777,923 A | 7/1998 | Lee et al. |
| 5,814,584 A | 9/1998 | Tauber et al. |
| 5,923,056 A | 7/1999 | Lee et al. |
| 5,958,140 A | 9/1999 | Arami et al. |
| 5,999,454 A | 12/1999 | Smith |
| 6,034,015 A | 3/2000 | Lin et al. |
| 6,060,755 A | 5/2000 | Ma et al. |

(Continued)

FOREIGN PATENT DOCUMENTS

EP     1096042     5/2001

(Continued)

OTHER PUBLICATIONS

Ahn, Kie Y., et al., "Lanthanide Yttrium Aluminum Oxide Dielectric Films", U.S. Appl. No. 11/297,567, filed Dec. 8, 2005.

(Continued)

*Primary Examiner*—Chuong Anh Luu
(74) *Attorney, Agent, or Firm*—Schwegman, Lundberg & Woessner, P.A.

(57) ABSTRACT

Dielectric layers containing a zirconium-doped tantalum oxide layer, where the zirconium-doped tantalum oxide layer is formed of one or more monolayers of tantalum oxide doped with zirconium, provide an insulating layer in a variety of structures for use in a wide range of electronic devices.

25 Claims, 7 Drawing Sheets

U.S. PATENT DOCUMENTS

| | | |
|---|---|---|
| 6,063,705 A | 5/2000 | Vaartstra |
| 6,173,379 B1 | 1/2001 | Poplingher et al. |
| 6,174,809 B1 | 1/2001 | Kang et al. |
| 6,207,522 B1 | 3/2001 | Hunt et al. |
| 6,210,999 B1 | 4/2001 | Gardner et al. |
| 6,270,835 B1 | 8/2001 | Hunt et al. |
| 6,274,937 B1 | 8/2001 | Ahn et al. |
| 6,281,042 B1 | 8/2001 | Ahn et al. |
| 6,291,341 B1 | 9/2001 | Sharan et al. |
| 6,297,103 B1 | 10/2001 | Ahn et al. |
| 6,297,539 B1 | 10/2001 | Ma et al. |
| 6,350,704 B1 | 2/2002 | Ahn et al. |
| 6,381,124 B1 | 4/2002 | Whitcher et al. |
| 6,383,861 B1 | 5/2002 | Gonzalez et al. |
| 6,392,257 B1 | 5/2002 | Ramdani et al. |
| 6,407,427 B1 | 6/2002 | Oh |
| 6,417,537 B1 | 7/2002 | Yang et al. |
| 6,433,993 B1 | 8/2002 | Hunt et al. |
| 6,452,229 B1 | 9/2002 | Krivokapic |
| 6,454,912 B1 | 9/2002 | Ahn et al. |
| 6,465,853 B1 | 10/2002 | Hobbs et al. |
| 6,495,436 B2 | 12/2002 | Ahn et al. |
| 6,504,214 B1 | 1/2003 | Yu et al. |
| 6,514,820 B2 | 2/2003 | Ahn et al. |
| 6,514,828 B2 | 2/2003 | Ahn et al. |
| 6,534,420 B2 | 3/2003 | Ahn et al. |
| 6,541,079 B1 | 4/2003 | Bojarczuk, Jr. et al. |
| 6,541,280 B2 | 4/2003 | Kaushik et al. |
| 6,542,229 B1 | 4/2003 | Kalal et al. |
| 6,544,846 B2 | 4/2003 | Ahn et al. |
| 6,552,383 B2 | 4/2003 | Ahn et al. |
| 6,562,491 B1 | 5/2003 | Jeon |
| 6,566,147 B2 | 5/2003 | Basceri et al. |
| 6,570,248 B1 | 5/2003 | Ahn et al. |
| 6,608,378 B2 | 8/2003 | Ahn et al. |
| 6,617,639 B1 | 9/2003 | Wang et al. |
| 6,630,383 B1 | 10/2003 | Ibok et al. |
| 6,632,279 B1 | 10/2003 | Ritala et al. |
| 6,638,810 B2 | 10/2003 | Bakli et al. |
| 6,656,764 B1 | 12/2003 | Wang et al. |
| 6,661,058 B2 | 12/2003 | Ahn et al. |
| 6,673,701 B1 | 1/2004 | Marsh et al. |
| 6,674,138 B1 | 1/2004 | Halliyal et al. |
| 6,699,747 B2 | 3/2004 | Ruff et al. |
| 6,710,538 B1 | 3/2004 | Ahn et al. |
| 6,720,221 B1 | 4/2004 | Ahn et al. |
| 6,728,092 B2 | 4/2004 | Hunt et al. |
| 6,730,163 B2 | 5/2004 | Vaartstra |
| 6,730,164 B2 | 5/2004 | Vaartstra et al. |
| 6,746,930 B2 | 6/2004 | Yang et al. |
| 6,750,126 B1 | 6/2004 | Visokay et al. |
| 6,756,298 B2 | 6/2004 | Ahn et al. |
| 6,760,257 B2 | 7/2004 | Huang et al. |
| 6,767,582 B1 | 7/2004 | Elers |
| 6,767,795 B2 | 7/2004 | Ahn et al. |
| 6,774,050 B2 | 8/2004 | Ahn et al. |
| 6,778,441 B2 | 8/2004 | Forbes et al. |
| 6,780,704 B1 | 8/2004 | Raaijmakers et al. |
| 6,784,049 B2 | 8/2004 | Vaartstra |
| 6,787,370 B2 | 9/2004 | Forbes |
| 6,787,413 B2 | 9/2004 | Ahn |
| 6,790,791 B2 | 9/2004 | Ahn et al. |
| 6,794,284 B2 | 9/2004 | Vaartstra |
| 6,794,709 B2 | 9/2004 | Ahn et al. |
| 6,803,326 B2 | 10/2004 | Ahn et al. |
| 6,812,100 B2 | 11/2004 | Ahn et al. |
| 6,812,157 B1 | 11/2004 | Gadgil |
| 6,821,862 B2 | 11/2004 | Cho |
| 6,821,873 B2 | 11/2004 | Visokay et al. |
| 6,828,632 B2 | 12/2004 | Bhattacharyya |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,844,203 B2 | 1/2005 | Ahn et al. |
| 6,844,604 B2 | 1/2005 | Lee et al. |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,863,725 B2 | 3/2005 | Vaartstra et al. |
| 6,884,739 B2 | 4/2005 | Ahn et al. |
| 6,888,739 B2 | 5/2005 | Forbes |
| 6,893,984 B2 | 5/2005 | Ahn et al. |
| 6,900,122 B2 | 5/2005 | Ahn et al. |
| 6,900,481 B2 | 5/2005 | Jin et al. |
| 6,914,800 B2 | 7/2005 | Ahn et al. |
| 6,919,266 B2 | 7/2005 | Ahn et al. |
| 6,921,702 B2 | 7/2005 | Ahn et al. |
| 6,930,346 B2 | 8/2005 | Ahn et al. |
| 6,933,225 B2 | 8/2005 | Werkhoven et al. |
| 6,949,433 B1 | 9/2005 | Hidehiko et al. |
| 6,953,730 B2 | 10/2005 | Ahn et al. |
| 6,958,300 B2 | 10/2005 | Vaartstra et al. |
| 6,958,302 B2 | 10/2005 | Ahn et al. |
| 6,960,538 B2 | 11/2005 | Ahn et al. |
| 6,967,159 B2 | 11/2005 | Vaartstra |
| 6,979,855 B2 | 12/2005 | Ahn et al. |
| 6,982,230 B2 | 1/2006 | Cabral, Jr. et al. |
| 6,984,592 B2 | 1/2006 | Vaartstra |
| 6,989,565 B1 | 1/2006 | Aronowitz et al. |
| 6,989,573 B2 | 1/2006 | Ahn et al. |
| 6,995,081 B2 | 2/2006 | Vaartstra |
| 6,995,437 B1 | 2/2006 | Kinoshita et al. |
| 7,012,297 B2 | 3/2006 | Bhattacharyya |
| 7,018,868 B1 | 3/2006 | Yang et al. |
| 7,026,694 B2 | 4/2006 | Ahn et al. |
| 7,030,042 B2 | 4/2006 | Vaartstra et al. |
| 7,037,574 B2 | 5/2006 | Paranjpe et al. |
| 7,041,609 B2 | 5/2006 | Vaartstra |
| 7,045,430 B2 | 5/2006 | Ahn et al. |
| 7,049,192 B2 | 5/2006 | Ahn et al. |
| 7,064,058 B2 | 6/2006 | Ahn et al. |
| 7,068,544 B2 | 6/2006 | Forbes et al. |
| 7,077,902 B2 | 7/2006 | Vaartstra |
| 7,081,421 B2 | 7/2006 | Ahn et al. |
| 7,084,078 B2 | 8/2006 | Ahn et al. |
| 7,087,481 B2 | 8/2006 | Vaartstra et al. |
| 7,101,813 B2 | 9/2006 | Ahn et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,115,566 B2 | 10/2006 | Bodor et al. |
| 7,122,415 B2 | 10/2006 | Jang et al. |
| 7,122,464 B2 | 10/2006 | Vaartstra |
| 7,125,815 B2 | 10/2006 | Vaartstra |
| 7,129,553 B2 | 10/2006 | Ahn et al. |
| 7,135,369 B2 | 11/2006 | Ahn et al. |
| 7,135,421 B2 | 11/2006 | Ahn et al. |
| 7,141,278 B2 | 11/2006 | Koh et al. |
| 7,160,577 B2 | 1/2007 | Ahn et al. |
| 7,160,817 B2 | 1/2007 | Marsh |
| 7,169,673 B2 | 1/2007 | Ahn et al. |
| 7,183,186 B2 | 2/2007 | Ahn et al. |
| 7,192,824 B2 | 3/2007 | Ahn et al. |
| 7,192,892 B2 | 3/2007 | Ahn et al. |
| 7,195,999 B2 * | 3/2007 | Forbes et al. ................ 438/585 |
| 7,196,007 B2 | 3/2007 | Vaartstra |
| 7,199,023 B2 | 4/2007 | Ahn et al. |
| 7,205,218 B2 | 4/2007 | Ahn et al. |
| 7,205,620 B2 | 4/2007 | Ahn et al. |
| 7,208,804 B2 | 4/2007 | Ahn et al. |
| 7,211,492 B2 | 5/2007 | Forbes et al. |
| 7,214,994 B2 | 5/2007 | Forbes et al. |
| 7,235,501 B2 | 6/2007 | Ahn et al. |

| Patent No. | Date | Inventor |
|---|---|---|
| 7,235,854 B2 | 6/2007 | Ahn et al. |
| 7,250,338 B2 | 7/2007 | Bhattacharyya |
| 7,250,367 B2 | 7/2007 | Vaartstra et al. |
| 7,253,122 B2 | 8/2007 | Vaartstra |
| 7,259,434 B2 | 8/2007 | Ahn et al. |
| 7,271,077 B2 | 9/2007 | Vaarstra et al. |
| 7,294,556 B2 | 11/2007 | Vaartstra |
| 7,300,870 B2 | 11/2007 | Vaartstra |
| 7,323,423 B2 | 1/2008 | Brask et al. |
| 7,332,442 B2 | 2/2008 | Vaartstra et al. |
| 7,374,617 B2 | 3/2008 | Vaartstra |
| 7,365,027 B2 | 4/2008 | Ahn et al. |
| 7,368,402 B2 | 5/2008 | Vaartstra |
| 7,374,964 B2 | 5/2008 | Ahn et al. |
| 7,388,246 B2 | 6/2008 | Ahn et al. |
| 7,390,756 B2 | 6/2008 | Ahn et al. |
| 7,402,876 B2 | 7/2008 | Ahn et al. |
| 7,405,454 B2 | 7/2008 | Ahn et al. |
| 7,410,668 B2 | 8/2008 | Ahn |
| 7,410,910 B2 | 8/2008 | Ahn et al. |
| 7,410,917 B2 | 8/2008 | Ahn et al. |
| 7,410,918 B2 | 8/2008 | Vaartstra |
| 7,411,237 B2 | 8/2008 | Ahn et al. |
| 7,432,548 B2 | 10/2008 | Forbes et al. |
| 7,439,194 B2 | 10/2008 | Ahn et al. |
| 7,494,939 B2 | 2/2009 | Ahn et al. |
| 7,498,230 B2 | 3/2009 | Ahn et al. |
| 7,508,025 B2 | 3/2009 | Eldridge et al. |
| 7,510,983 B2 | 3/2009 | Ahn et al. |
| 7,517,783 B2 | 4/2009 | Ahn et al. |
| 7,518,246 B2 | 4/2009 | Ahn et al. |
| 7,531,869 B2 | 5/2009 | Ahn et al. |
| 7,554,161 B2 | 6/2009 | Ahn et al. |
| 7,560,395 B2 | 7/2009 | Ahn |
| 7,563,730 B2 | 7/2009 | Forbes et al. |
| 7,572,695 B2 | 8/2009 | Ahn et al. |
| 7,588,988 B2 | 9/2009 | Ahn et al. |
| 7,592,251 B2 | 9/2009 | Ahn et al. |
| 7,601,649 B2 | 10/2009 | Ahn et al. |
| 7,602,030 B2 | 10/2009 | Ahn et al. |
| 7,611,959 B2 | 11/2009 | Ahn et al. |
| 7,615,438 B2 | 11/2009 | Ahn et al. |
| 7,625,794 B2 | 12/2009 | Ahn et al. |
| 7,662,729 B2 | 2/2010 | Ahn et al. |
| 7,670,646 B2 | 3/2010 | Ahn et al. |
| 7,687,409 B2 | 3/2010 | Ahn et al. |
| 2001/0005625 A1 | 6/2001 | Sun et al. |
| 2001/0009695 A1 | 7/2001 | Saanila et al. |
| 2001/0012698 A1 | 8/2001 | Hayashi et al. |
| 2001/0014526 A1 | 8/2001 | Clevenger et al. |
| 2001/0019876 A1 | 9/2001 | Juengling et al. |
| 2001/0030352 A1 | 10/2001 | Ruf et al. |
| 2001/0034117 A1 | 10/2001 | Eldridge et al. |
| 2001/0050438 A1 | 12/2001 | Juengling et al. |
| 2002/0000593 A1 | 1/2002 | Nishiyama et al. |
| 2002/0001971 A1 | 1/2002 | Cho |
| 2002/0004276 A1 | 1/2002 | Ahn et al. |
| 2002/0004277 A1 | 1/2002 | Ahn et al. |
| 2002/0019125 A1 | 2/2002 | Juengling et al. |
| 2002/0024080 A1 | 2/2002 | Derderian et al. |
| 2002/0025628 A1 | 2/2002 | Derderian et al. |
| 2002/0028541 A1 | 3/2002 | Lee et al. |
| 2002/0037603 A1 | 3/2002 | Eldridge et al. |
| 2002/0046705 A1 | 4/2002 | Sandhu et al. |
| 2002/0053869 A1 | 5/2002 | Ahn et al. |
| 2002/0072164 A1 | 6/2002 | Umotoy et al. |
| 2002/0083464 A1 | 6/2002 | Tomsen et al. |
| 2002/0086507 A1 | 7/2002 | Park et al. |
| 2002/0089023 A1 | 7/2002 | Yu et al. |
| 2002/0100418 A1 | 8/2002 | Sandhu et al. |
| 2002/0102818 A1 | 8/2002 | Sandhu et al. |
| 2002/0110991 A1 | 8/2002 | Li |
| 2002/0111001 A1 | 8/2002 | Ahn |
| 2002/0117704 A1 | 8/2002 | Gonzalez |
| 2002/0122885 A1 | 9/2002 | Ahn |
| 2002/0132374 A1 | 9/2002 | Basceri et al. |
| 2002/0135048 A1 | 9/2002 | Ahn et al. |
| 2002/0142536 A1 | 10/2002 | Zhang et al. |
| 2002/0145845 A1 | 10/2002 | Hunt et al. |
| 2002/0146916 A1 | 10/2002 | Irino et al. |
| 2002/0155688 A1 | 10/2002 | Ahn |
| 2002/0155689 A1 | 10/2002 | Ahn |
| 2002/0164420 A1 | 11/2002 | Derderian et al. |
| 2002/0167057 A1 | 11/2002 | Ahn et al. |
| 2002/0170671 A1 | 11/2002 | Matsuhita et al. |
| 2002/0176989 A1 | 11/2002 | Knudsen et al. |
| 2002/0177244 A1 | 11/2002 | Hsu et al. |
| 2002/0190294 A1 | 12/2002 | Iizuka et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2002/0196405 A1 | 12/2002 | Colgan et al. |
| 2002/0197793 A1 | 12/2002 | Dornfest et al. |
| 2002/0197856 A1 | 12/2002 | Matsuse et al. |
| 2002/0197881 A1 | 12/2002 | Ramdani et al. |
| 2003/0001190 A1 | 1/2003 | Basceri et al. |
| 2003/0001241 A1 | 1/2003 | Chakrabarti et al. |
| 2003/0003702 A1 | 1/2003 | Ahn |
| 2003/0003722 A1 | 1/2003 | Vaartstra |
| 2003/0003730 A1 | 1/2003 | Li |
| 2003/0004051 A1 | 1/2003 | Kim et al. |
| 2003/0017717 A1 | 1/2003 | Ahn |
| 2003/0027360 A1 | 2/2003 | Hsu et al. |
| 2003/0032238 A1 | 2/2003 | Kim et al. |
| 2003/0040196 A1 | 2/2003 | Lim et al. |
| 2003/0043637 A1 | 3/2003 | Forbes et al. |
| 2003/0045060 A1 | 3/2003 | Ahn et al. |
| 2003/0045078 A1 | 3/2003 | Ahn et al. |
| 2003/0064607 A1 | 4/2003 | Leu et al. |
| 2003/0119246 A1 | 6/2003 | Ahn |
| 2003/0119291 A1 | 6/2003 | Ahn et al. |
| 2003/0132491 A1 | 7/2003 | Ahn |
| 2003/0139039 A1 | 7/2003 | Ahn et al. |
| 2003/0143801 A1 | 7/2003 | Basceri et al. |
| 2003/0157764 A1 | 8/2003 | Ahn et al. |
| 2003/0172872 A1 | 9/2003 | Thakur et al. |
| 2003/0176065 A1 | 9/2003 | Vaartstra |
| 2003/0200917 A1 | 10/2003 | Vaartstra |
| 2003/0207032 A1 | 11/2003 | Ahn et al. |
| 2003/0207540 A1 | 11/2003 | Ahn et al. |
| 2003/0213987 A1 | 11/2003 | Basceri |
| 2003/0216038 A1 | 11/2003 | Madhukar et al. |
| 2003/0227033 A1 | 12/2003 | Ahn et al. |
| 2003/0228747 A1 | 12/2003 | Ahn et al. |
| 2003/0235064 A1 | 12/2003 | Batra et al. |
| 2003/0235961 A1 | 12/2003 | Metzner et al. |
| 2004/0005982 A1 | 1/2004 | Park et al. |
| 2004/0007171 A1 | 1/2004 | Ritala et al. |
| 2004/0016944 A1 | 1/2004 | Ahn et al. |
| 2004/0023461 A1 | 2/2004 | Ahn et al. |
| 2004/0033681 A1 | 2/2004 | Ahn et al. |
| 2004/0033701 A1 | 2/2004 | Ahn et al. |
| 2004/0038554 A1 | 2/2004 | Ahn |
| 2004/0040494 A1 | 3/2004 | Vaartstra et al. |
| 2004/0040501 A1 | 3/2004 | Vaartstra |
| 2004/0043151 A1 | 3/2004 | Vaartstra |
| 2004/0043541 A1 | 3/2004 | Ahn et al. |
| 2004/0043569 A1 | 3/2004 | Ahn et al. |
| 2004/0043578 A1 | 3/2004 | Marsh |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |

| | | |
|---|---|---|
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0092073 A1 | 5/2004 | Cabral, Jr. et al. |
| 2004/0094801 A1 | 5/2004 | Liang et al. |
| 2004/0104439 A1 | 6/2004 | Haukka et al. |
| 2004/0110348 A1 | 6/2004 | Ahn et al. |
| 2004/0110391 A1 | 6/2004 | Ahn et al. |
| 2004/0126954 A1 | 7/2004 | Vaarstra et al. |
| 2004/0135186 A1 | 7/2004 | Yamamoto |
| 2004/0144980 A1 | 7/2004 | Ahn et al. |
| 2004/0152254 A1 | 8/2004 | Vaartstra et al. |
| 2004/0159863 A1 | 8/2004 | Eldridge et al. |
| 2004/0164357 A1 | 8/2004 | Ahn et al. |
| 2004/0164365 A1 | 8/2004 | Ahn et al. |
| 2004/0169453 A1 | 9/2004 | Ahn et al. |
| 2004/0175882 A1 | 9/2004 | Ahn et al. |
| 2004/0178439 A1 | 9/2004 | Ahn et al. |
| 2004/0183108 A1 | 9/2004 | Ahn |
| 2004/0185654 A1 | 9/2004 | Ahn |
| 2004/0187968 A1 | 9/2004 | Vaartstra |
| 2004/0189175 A1 | 9/2004 | Ahn et al. |
| 2004/0196620 A1 | 10/2004 | Knudsen et al. |
| 2004/0197946 A1 | 10/2004 | Vaartstra et al. |
| 2004/0206957 A1 | 10/2004 | Inoue et al. |
| 2004/0214399 A1 | 10/2004 | Ahn et al. |
| 2004/0217410 A1 | 11/2004 | Meng et al. |
| 2004/0219746 A1 | 11/2004 | Vaartstra et al. |
| 2004/0219783 A1 | 11/2004 | Ahn et al. |
| 2004/0222476 A1 | 11/2004 | Ahn et al. |
| 2004/0229745 A1 | 11/2004 | Miyauchi et al. |
| 2004/0233010 A1 | 11/2004 | Akram et al. |
| 2004/0248398 A1 | 12/2004 | Ahn et al. |
| 2004/0262700 A1 | 12/2004 | Ahn et al. |
| 2005/0009266 A1 | 1/2005 | Vaartstra |
| 2005/0009335 A1 | 1/2005 | Dean et al. |
| 2005/0009368 A1 | 1/2005 | Vaartstra |
| 2005/0009370 A1 | 1/2005 | Ahn |
| 2005/0019978 A1 | 1/2005 | Vaartstra et al. |
| 2005/0020017 A1 | 1/2005 | Ahn et al. |
| 2005/0023578 A1 | 2/2005 | Bhattacharyya |
| 2005/0023594 A1 | 2/2005 | Ahn et al. |
| 2005/0023603 A1 | 2/2005 | Eldridge et al. |
| 2005/0023613 A1 | 2/2005 | Bhattacharyya |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0028733 A1 | 2/2005 | Vaartstra |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0032360 A1 | 2/2005 | Vaartstra |
| 2005/0034662 A1 | 2/2005 | Ahn |
| 2005/0037563 A1 | 2/2005 | Ahn |
| 2005/0040034 A1 | 2/2005 | Landgraf et al. |
| 2005/0054165 A1 | 3/2005 | Ahn et al. |
| 2005/0112874 A1 | 5/2005 | Skarp et al. |
| 2005/0124171 A1 | 6/2005 | Vaartstra |
| 2005/0136689 A9 | 6/2005 | Vaartstra |
| 2005/0140462 A1 | 6/2005 | Akram et al. |
| 2005/0145957 A1 | 7/2005 | Ahn et al. |
| 2005/0151261 A1 | 7/2005 | Kellar et al. |
| 2005/0160981 A9 | 7/2005 | Vaartstra et al. |
| 2005/0173755 A1 | 8/2005 | Forbes |
| 2005/0221006 A1 | 10/2005 | Vaartstra |
| 2005/0260357 A1 | 11/2005 | Olsen et al. |
| 2005/0285225 A1 | 12/2005 | Ahn et al. |
| 2005/0287804 A1 | 12/2005 | Vaartstra |
| 2005/0287819 A1 | 12/2005 | Vaartstra et al. |
| 2006/0008966 A1 | 1/2006 | Forbes et al. |
| 2006/0019033 A1 | 1/2006 | Muthukrishnan et al. |
| 2006/0024975 A1 | 2/2006 | Ahn et al. |
| 2006/0043492 A1 | 3/2006 | Ahn et al. |
| 2006/0043504 A1 | 3/2006 | Ahn et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0170032 A1 | 8/2006 | Bhattacharyya |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0189154 A1 | 8/2006 | Ahn et al. |
| 2006/0223337 A1 | 10/2006 | Ahn et al. |
| 2006/0228868 A1* | 10/2006 | Ahn et al. .................. 438/453 |
| 2006/0231017 A1 | 10/2006 | Vaartstra |
| 2006/0237764 A1 | 10/2006 | Ahn et al. |
| 2006/0244082 A1 | 11/2006 | Ahn et al. |
| 2006/0244100 A1 | 11/2006 | Ahn et al. |
| 2006/0245984 A1 | 11/2006 | Kulkarni et al. |
| 2006/0246741 A1 | 11/2006 | Ahn et al. |
| 2006/0252211 A1 | 11/2006 | Ahn et al. |
| 2006/0252244 A1 | 11/2006 | Vaartstra et al. |
| 2006/0252279 A1 | 11/2006 | Vaartstra |
| 2006/0255470 A1 | 11/2006 | Ahn et al. |
| 2006/0258175 A1 | 11/2006 | Vaartstra et al. |
| 2006/0261389 A1 | 11/2006 | Vaartstra |
| 2006/0261397 A1 | 11/2006 | Ahn et al. |
| 2006/0263972 A1 | 11/2006 | Ahn et al. |
| 2006/0264064 A1 | 11/2006 | Ahn et al. |
| 2006/0270147 A1 | 11/2006 | Ahn et al. |
| 2006/0281330 A1 | 12/2006 | Ahn et al. |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0020835 A1 | 1/2007 | Ahn et al. |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0047319 A1 | 3/2007 | Bhattacharyya |
| 2007/0048926 A1 | 3/2007 | Ahn |
| 2007/0048953 A1 | 3/2007 | Gealy et al. |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0107661 A1 | 5/2007 | Ahn |
| 2007/0111544 A1 | 5/2007 | Ahn |
| 2007/0131169 A1 | 6/2007 | Ahn |
| 2007/0134931 A1 | 6/2007 | Ahn et al. |
| 2007/0134942 A1 | 6/2007 | Ahn et al. |
| 2007/0141832 A1 | 6/2007 | Farrar |
| 2007/0144438 A1 | 6/2007 | Vaartstra |
| 2007/0151861 A1 | 7/2007 | Xi et al. |
| 2007/0155190 A1 | 7/2007 | Vaartstra et al. |
| 2007/0158765 A1 | 7/2007 | Ahn et al. |
| 2007/0161260 A1 | 7/2007 | Vaartstra |
| 2007/0166999 A1 | 7/2007 | Vaartstra |

| | | | |
|---|---|---|---|
| 2007/0178643 | A1 | 8/2007 | Forbes et al. |
| 2007/0181931 | A1 | 8/2007 | Ahn et al. |
| 2007/0187772 | A1 | 8/2007 | Ahn et al. |
| 2007/0187831 | A1 | 8/2007 | Ahn et al. |
| 2007/0234949 | A1 | 10/2007 | Ahn et al. |
| 2007/0295273 | A1 | 12/2007 | Vaartstra |
| 2008/0029790 | A1 | 2/2008 | Ahn et al. |
| 2008/0032424 | A1 | 2/2008 | Ahn et al. |
| 2008/0032465 | A1 | 2/2008 | Ahn et al. |
| 2008/0048225 | A1 | 2/2008 | Ahn et al. |
| 2008/0057659 | A1 | 3/2008 | Forbes |
| 2008/0057690 | A1 | 3/2008 | Forbes |
| 2008/0064210 | A1 | 3/2008 | Vaartstra |
| 2008/0087890 | A1 | 4/2008 | Ahn et al. |
| 2008/0087945 | A1 | 4/2008 | Forbes et al. |
| 2008/0102629 | A1 | 5/2008 | Vaartstra |
| 2008/0121962 | A1 | 5/2008 | Forbes et al. |
| 2008/0124907 | A1 | 5/2008 | Forbes et al. |
| 2008/0124908 | A1 | 5/2008 | Forbes et al. |
| 2008/0191350 | A1 | 8/2008 | Ahn et al. |
| 2008/0191351 | A1 | 8/2008 | Ahn et al. |
| 2008/0193791 | A1 | 8/2008 | Ahn et al. |
| 2008/0194094 | A1 | 8/2008 | Ahn et al. |
| 2008/0217676 | A1 | 9/2008 | Ahn et al. |
| 2008/0274625 | A1 | 11/2008 | Ahn et al. |
| 2009/0032910 | A1 | 2/2009 | Ahn et al. |
| 2010/0006918 | A1 | 1/2010 | Ahn et al. |
| 2010/0029054 | A1 | 2/2010 | Ahn et al. |
| 2010/0044771 | A1 | 2/2010 | Ahn et al. |
| 2010/0052033 | A1 | 3/2010 | Ahn et al. |

FOREIGN PATENT DOCUMENTS

| | | |
|---|---|---|
| EP | 1124262 A2 | 8/2001 |
| EP | 1324376 | 7/2003 |
| WO | WO-2006026716 | 3/2006 |

OTHER PUBLICATIONS

Ahn, Kie Y., "Lanthanum Aluminum Oxynitride Dielectric Films", U.S. Appl. No. 11/216,474, filed Aug. 31, 2005.

Ahn, Kie Y., et al., "Magnesium Titanium Oxide Films", U.S. Appl. No. 11/189,075, filed Jul. 25, 2005.

Alers, G. B., et al., "Intermixing at the tantalum oxide/silicon interface in gate dielectric structures", Applied Physics Letters, 73(11), (Sep. 14, 1998), 1517-1519.

Atanassova, E., et al., "Breakdown Fields and Conduction Mechanisms in thin $Ta_2O_5$ Layers on Si for high density DRAMs", Microelectronics Reliability, 42, (2002), 157-173.

Cava, R. J., et al., "Dielectric Properties of $Ta_2O_5$-$ZrO_2$ polycrystalline ceramics", J. Appl. Phys. 83(3), (Feb. 1, 1998), 1613-1616.

Cava, R. J., et al., "Improvement of the dielectric properties of $Ta_2/O_5$ through substitution with $Al_2O_3$", Applied Physics Letters, 70(11), (Mar. 1997), 1396-8.

Chaneliere, C., et al., "Tantalum Pentoxide ($Ta_2O_5$) thin films for advanced dielectric applications", Materials Science and Engineering R22, (269-322), 1998.

Chang, J. P., et al., "Dielectric property and conduction mechanism of ultrathin zirconium oxide films", Applied Physics Letters, 79(22), (Nov. 26, 2001), 3666-3668.

Copel, M., et al., "Structure and stability of ultrathin zirconium oxide layers on Si(001)", Applied Physics Letters, 76(4), (Jan. 2000), 436-438.

Fleming, R. M., et al., "Defect Dominated Charge Transport in Amorphous $Ta_2O_5$ thin films", Journal of Applied Physics, 88(2), (Jul. 15, 2000), 850-862.

Hori, T, ""MIS Structure", Gate Dielectrics and MOS ULSIs: Principles, Technologies, and Applications", Chapter 2, Springer-Verlag, Inc., New York, Springer Series in Electronics and Photonics 34, (1997), 23-74.

Hubbard, K. J., et al., "Thermodynamic stability of binary oxides in contact with silicon", Journal of Materials Research, 11(11), (Nov. 1996), 2757-2776.

Jeon, T. S., "Thermal Stability of ultrathin $ZrO_2$ films prpared by chemical vapor deposition of Si(100)", Appl. Phys. Lett., 78(3), (Jan. 15, 2001), 368-370.

Joshi, P. C., et al., "Structural and Electrical Properties of Crystalline (1-x) $Ta_2O_5$-$xAl_2O_3$ thin films fabricated by metalorganic solution deposition technique", Appl. Phys. Letters 71(10), (Sep. 8, 1997), 1341-1343.

Kang, Chang, et al., "Improved Thermal Stability and Device Performance of Ultra-thin (EOT<10A) Gate Dielectric MOSFETs by using Hafnium Oxynitride ($HfO_xN_y$)", Symposium on VLSI Technology Digest of Technical Papers, (2002), 146-147.

Kingon, Angus I., et al., "Alternative dielectrics to Silicon dioxide for Memory and Logic Devices", Nature, vol. 406, (Aug. 31, 2000), 1032-1038.

Kukli, Kaupo, "Dielectric Properties of Zirconium Oxide Grown by Atomic Layer Deposition from Iodide Precursor", Journal of The Electrochemical Society, 148(12), (2001), F227-F232.

Kukli, Kaupo, et al., "Properties of $Ta_2O_5$-Based Dielectric Nanolaminates Deposited by Atomic Layer Epitaxy", J. Electrochem. Soc., vol. 144, No. 1, Deptartment of Chemistry, University of Helsinki, FIN-00014, Helsinki, Finland,(Jan. 1997), 300-306.

Kukli, Kaupo, "Tailoring the dielectric properties of $HfO_2$- $Ta_2O_3$ nanolaminates", Appl. Phys. Lett., 68, (1996), 3737-3739.

Kuo, Yue, et al., "Anomalous TixTayO High K Thin Films", The Electrochemical Soc. Meeting Abstracts, Abstract 227, vol. 2001-1, Washington, DC, (Mar. 25-29, 2001), 1 page.

Kuo, Yue, et al., "Doped Tantalum Oxide High K Dielectric Thin Films", The Electrochemical Soc. Meeting Abstract, 813, vol. 2000-2, (Oct. 22-27, 2002), 1 page.

Lu, J., et al., "Hafnium-Doped Tantalum Oxide High-K Dielectrics", The Electrochemical Soc. Meeting Abstract, Abstract 379, vol. 2002, Salt Lake City, UT, (Oct. 20-204, 2002), 1 page.

Luan, H. F., et al., "Ultra Thin High Quality $Ta_2O_5$ Gate Dielectric Prepared by in-situ Rapid Thermal Processing", Int. Electron Devices Meeting, (1999), 609-612.

Lucovsky, Gerald, et al., "The Effects of Chemical Bonding and Band Offsett Constraints at Si-Dielectric Interfaces on the Integration of Alternative High-K Dielectrics into Aggressively-Scaled CMOS Si Devices", Microelectronic Engineering, 48, (1999), 291-294.

Manchanda, L., et al., "Multi-component high-K gate dielectrics for the silicon industry", Microelectronic Engineering, 59, (2001), 351-359.

Miyazaki, Seiichi, "Characterization of high-k gate dielectric/silicon interfaces", Applied Surface Science 190, (2002), 66-74.

Park, Donggun, et al., "SiON/Ta2O5/TiN Gate-Stack Transistor with 1.8nm Equivalent SiO2 Thickness", Int. Electron Devices Meeting, (1998), 381-384.

Qi, Wen-Jie, et al., "MOSCAP and MOSFET characteristics using ZrO/sub 2/gate dielectric deposited directly on Si", International Electron Devices Meeting 1999. Technical Digest, (1999), 145-148.

Sneh, Ofer, "Thin film atomic layer deposition equipment for semiconductor processing", Thin Solid Films, 402, (2002), 248-261.

Tewg, J.Y., "Electrical and Physical Characterization of Zirconium-Doped Tantalum Oxide Films", Electrochemical Society Proceedings, vol. 2002-28, (2002), 75-81.

Tewg, J. Y., et al., "Electrical and Physical Characterization of Zirconium-doped Tantalum Oxide Films", The Electrochemical Soc. Meeting Abstract, Abstract 376, vol. 2002-2, Salt Lake City, UT, (Oct. 20-24, 2002), 1 page.

Tewg, Jun-Yen, "Electrical and Physical Characterization of Zirconium-Doped Tantalum Oxide Thin FIlms", Journal of the Electrochemical Society, 151 (3), (2004), F59-F67.

Ulrich, M. D., et al., "Interface electronic structure of $Ta_2O_5$—$Al_2O_3$ alloys for Si-field-effect transistor gate dielectric applications", J. Vacuum Sci. Technology, B 20(4), (Jul./Aug. 2002), 1732-1738.

Virola, H, "Controlled growth of antimony-doped tin dioxide thin films by atomic layer epitaxy", Thin Solid Films, 251, (Nov. 1994), 127-135.

Wilk, G D., et al., "Hafnium and zirconium silicates for advanced gate dielectrics", Journal of Applied Physics, 87(1), (Jan. 2000), 484-492.

Wilk, G. D., "High-K gate dielectrics: Current status and materials properties considerations", *Journal of Applied Physics*, 89(10), (2001),5243-5275.

Wilk, G. D., et al., "Stable zirconium silicate gate dielectrics deposited directly on silicon", *Applied Physics Letters*, vol. 76, No. 1, (Jan. 3, 1000),112-114.

Zhang, H., et al., "High permitivity thin film nanolaminates", *Journal of Applied Physics*, 87(4), (Feb. 2000),1921-1924.

Leskela, M., "ALD precursor chemistry: Evolution and future challenges", *J. Phys. IV* France, 9, (1999), 837-852.

* cited by examiner

US 7,776,762 B2

ZIRCONIUM-DOPED TANTALUM OXIDE FILMS

This application is a divisional of U.S. application Ser. No. 10/909,959 filed Aug. 2, 2004, now U.S. Pat. No. 7,601,649 which is incorporated herein by reference in its entirety.

TECHNICAL FIELD

This application relates generally to semiconductor devices and device fabrication and, more particularly, to dielectric layers and their method of fabrication.

BACKGROUND

The semiconductor device industry has a market driven need to improve speed performance, improve its low static (off-state) power requirements, and lower production costs for its silicon based microelectronic products. In particular, there is continuous pressure to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. The ultimate goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

DETAILED DESCRIPTION

Figure 1:
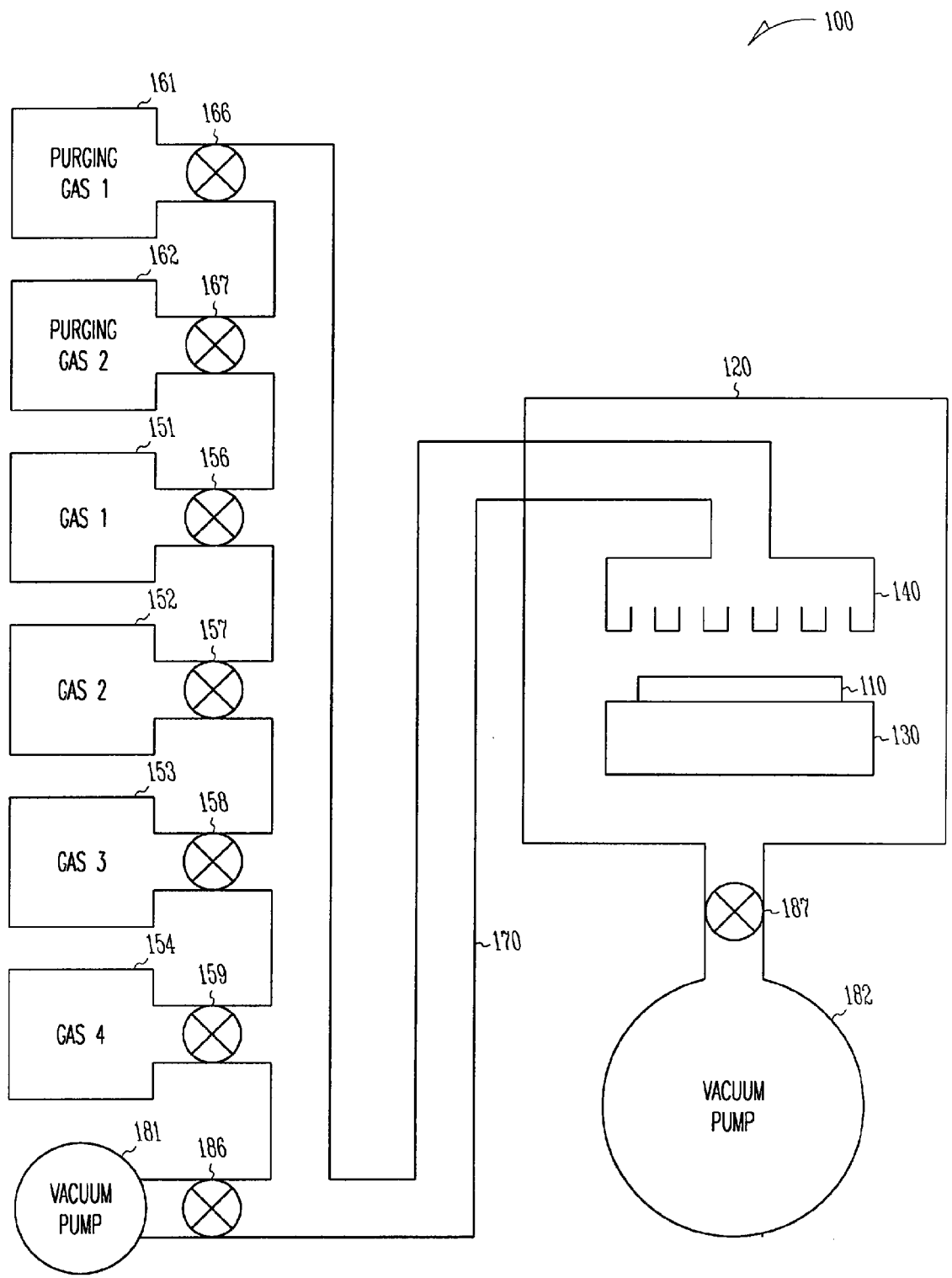
FIG. 1 depicts an atomic layer deposition system for fabricating a dielectric layer containing a zirconium-doped tantalum oxide, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$-Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}=3.9$, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages using $SiO_2$ as a gate dielectric has been that the formation of the $SiO_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

High-κ materials include materials having a dielectric constant greater than silicon dioxide, for example, dielectrics materials having a dielectric constant greater than about twice the dielectric constant of silicon dioxide. By introducing a dopant into a high-κ metal oxide dielectric, its amorphous-to-polycrystalline temperature can be increased. The dopant acts to disturb the ordered structure of the original film. Elements usable as dopants in some high-κ materials have include Si, Al, Zr, Hf, and N. By adjusting the amount of the dopants in the original film, the physical and electrical properties of such metal oxides may be tailored. Bulk $(Ta_2O_5)_{1-x}(Zr_2O)_x$ polycrystalline ceramics, formed by mixing powders of $Ta_2O_5$ and $Zr_2O$ and sintering at high temperatures, have increased dielectric constants with respect to $Ta_2O_5$ for certain amounts of Zr in the bulk $(Ta_2O_5)_{1-x}(Zr_2O)_x$ structure.

An appropriate high-κ gate dielectric should have a large energy gap ($E_g$) and large energy barrier heights with Si for both electrons and holes. Generally, the bandgap is inversely related to the dielectric constant for a high-κ material, which lessens some advantages of the high-κ material. Tantalum oxide ($Ta_2O_5$) is a potential replacement for $SiO_2$. It has a bandgap of about 4.5 eV and a dielectric constant of about 26. Further, $Ta_2O_5$ is a suitable candidate for engineering its physical and electrical properties by doping, since its structure does not change significantly with the addition of a substantial amount of another oxide. However, forming $Ta_2O_5$ on a silicon substrate may result in an interface layer that contains $SiO_2$, in particular at processing temperatures above 700° C. The material composition and its properties of an interface layer are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer, may improve the interface density, fixed charge density, and channel mobility of a device having this interface layer.

An embodiment for a method for forming a dielectric layer includes forming a dielectric film containing a zirconium-doped tantalum oxide by depositing tantalum on a substrate surface by atomic layer deposition and by depositing zirconium by atomic layer deposition on the substrate surface. Embodiments include structures for capacitors, transistors, memory devices, and electronic systems with dielectric layers containing atomic layer deposited zirconium-doped tantalum oxide, and methods for forming such structures.

Embodiments for forming a tantalum oxide layer, or film, by atomic layer deposition include doping the tantalum oxide with zirconium. An undoped tantalum oxide film may be a film having a specific stoichiometry such as $Ta_2O_5$ or it may be a non-stoichiometric tantalum oxide, $Ta_yO_x$, which is represented herein as $TaO_x$. The zirconium doping may be performed as a doping by zirconium atoms or by zirconium oxide $ZrO_x$, where x may be x=2. The resulting film may be considered $TaO_x$ doped with Zr or $ZrO_x$.

Embodiments of dielectric layers containing an atomic layer deposited zirconium-doped tantalum oxide layer have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

In an embodiment, a zirconium-doped tantalum oxide dielectric film having a substantially smooth surface relative to other processing techniques is formed using atomic layer deposition (ALD). Further, forming such a dielectric film using atomic layer deposition can provide for controlling transitions between material layers. Thus, atomic layer deposited zirconium-doped tantalum oxide dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other requirements for precursors used in ALD. The precursors should be thermally stable at the substrate temperature because their decomposition would destroy the surface control and accordingly the advantages of the ALD method which relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes RS-ALD allows for deposition control on the order on monolayers and the ability to deposit monolayers of amorphous films.

Herein, a sequence refers to the ALD material formation based on an ALD reaction of one precursor with its reactant precursor. For example, forming tantalum oxide from a $TaI_4$ precursor and $H_2O_2$, as its reactant precursor, forms an embodiment of a tantalum/oxygen sequence, which can also be referred to as tantalum sequence. A cycle of a sequence includes pulsing a precursor, pulsing a purging gas for the precursor, pulsing a reactant precursor, and pulsing the reactant's purging gas.

In an embodiment, a layer of zirconium-doped $TaO_x$ is formed on a substrate mounted in a reaction chamber using ALD in a repetitive sequence using precursor gases individually pulsed into the reaction chamber. Alternately, solid or liquid precursors can be used in an appropriately designed reaction chamber.

FIG. 1 shows an embodiment of an atomic layer deposition system 100 for processing a dielectric film containing zirconium-doped tantalum oxide. The elements depicted permit discussion of the present invention such that those skilled in the art may practice the present invention without undue experimentation. In FIG. 1, a substrate 110 is located inside a reaction chamber 120 of ALD system 100. Also located within the reaction chamber 120 is a heating element 130 which is thermally coupled to substrate 110 to control the substrate temperature. A gas-distribution fixture 140 introduces precursor gases to the substrate 110. Each precursor gas originates from individual gas sources 151-154 whose flow is controlled by mass-flow controllers 156-159, respectively. Gas sources 151-154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases less purging gas sources are required for ALD system 100. Gas sources 151-154 and purging gas sources 161-162 are coupled by their associated mass-flow controllers to a common gas line or conduit 170 which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases at the end of a purging sequence from the gas conduit.

Vacuum pump, or exhaust pump, 182 is coupled by mass-flow controller 187 to remove excess precursor gases, purging gases, and by-product gases at the end of a purging sequence from reaction chamber 120. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other ALD systems commercially available can be used.

The use, construction and fundamental operation of reaction chambers for deposition of films are understood by those of ordinary skill in the art of semiconductor fabrication. The present invention man be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 can be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be under computer control.

Figure 2:
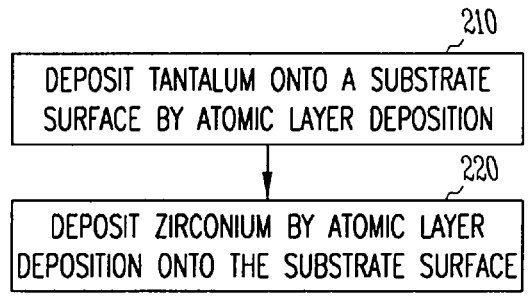
FIG. 2 illustrates a flow diagram of elements for an embodiment of a method to form a dielectric layer containing a zirconium-doped tantalum oxide, according to various embodiments of the present invention.

FIG. 2 illustrates a flow diagram of elements for an embodiment of a method to form a dielectric layer containing a zirconium-doped tantalum oxide. At 210, tantalum is deposited onto a substrate surface by atomic layer deposition. A number of precursors containing tantalum may be used to deposit the tantalum. In addition, the pulsing of the tantalum precursor may use a pulsing period that provides uniform coverage of a monolayer on the surface or may use a pulsing period that provides partial formation of a monolayer on the surface. At 220, zirconium is deposited by atomic layer deposition on the substrate surface. A reaction precursor may be pulsed after each pulsing of the tantalum precursor to form $TaO_x$ and another reaction precursor may be pulsed after each pulsing of the zirconium precursor to dope the $TaO_x$ with $ZrO_x$. The two reaction precursors may have a common composition. In an embodiment, to provide zirconium atom doping, deposition of the zirconium is not followed by a reaction precursor but by another pulsing of the tantalum precursor. Alternately, a reaction precursor to provide an oxidizing precursor may be pulsed after tantalum and zirconium have deposited. Appropriate purging pulses are performed between the pulsing of each element bearing precursor and each reaction precursor. The pulsing of the tantalum and zirconium precursors may be regulated to provide a selected ratio of zirconium atoms to the sum of tantalum and zirconium atoms to provide a desired doping.

Figure 3:
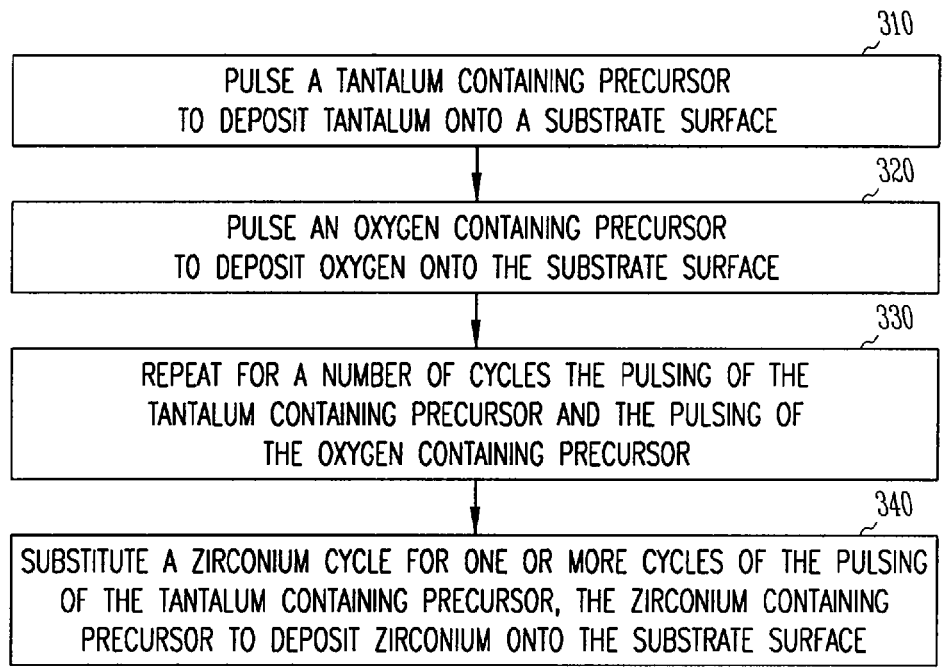
FIG. 3 illustrates a flow diagram of elements for an embodiment of a method to form a dielectric layer containing a zirconium-doped tantalum oxide, according to the present invention.

FIG. 3 illustrates a flow diagram of elements for an embodiment of a method to form a dielectric layer containing a zirconium-doped tantalum oxide. At 310, a tantalum containing precursor is pulsed to deposit tantalum onto a substrate surface. A number of precursors containing tantalum may be used to deposit the tantalum. At 320, an oxygen containing precursor is pulsed to deposit oxygen on the substrate surface. A number of precursors containing oxygen may be used to deposit the oxygen. The tantalum on the substrate surface and the oxygen react to form one or more monolayers or a portion of a monolayer of $TaO_x$. Precursors may be used that contain tantalum and oxygen such that $TaO_x$ is deposited on the substrate surface in a single pulsing. Appropriate purging pulses may be generated between the pulsing of the tantalum bearing precursor and the pulsing of the oxygen bearing precursor. At 330, a number of cycles of the pulsing of the tantalum containing precursor and the pulsing of the oxygen containing precursor is repeated. The number of cycles depends on the monolayer coverage desired and the desired amount of the tantalum to be contained in the doped $TaO_x$ being processed. At 340, a zirconium cycle is substituted for one or more cycles of the pulsing of the tantalum containing precursor, where the zirconium containing precursor deposits zirconium onto the substrate surface. A number of precursors containing zirconium and a number of precursors containing oxygen may be used to deposit $ZrO_x$ as the dopant for the $TaO_x$ film being formed. Cycles using a number of precursors containing zirconium without an oxidizing reaction precursor may be used to deposit Zr as the dopant for the $TaO_x$ film being formed.

In the embodiment of FIG. 3, to provide the zirconium dopant into the $TaO_x$ film, a variation to the repeated cycles may be made. The doping is included in the atomic layer deposition process by pulsing a zirconium containing precursor and reactant precursor in place of one or more cycles of the tantalum sequence. Associated with the dopant cycle there is also a growth rate substantially constant at a fixed number of angstroms per cycle, for constant environmental conditions in the reaction chamber and constant sequencing parameters in the dopant cycle. However, when a combined cycle consists of a large number of cycles of a tantalum sequence for one cycle of a zirconium dopant cycle, the growth rate for forming the zirconium-doped $TaO_x$ dielectric film may be substantially the same as for an undoped $TaO_x$ dielectric film. When the number of cycles for a zirconium dopant sequence is no longer small with respect to the number of cycles for a tantalum sequence, growth rates can vary from that of an undoped $TaO_x$ dielectric film. As can be understood by those skilled in the art, particular growth rates can be determined during normal initial testing of the ALD system for processing a zirconium-doped $TaO_x$ dielectric film for a given application without undue experimentation.

Figure 4:
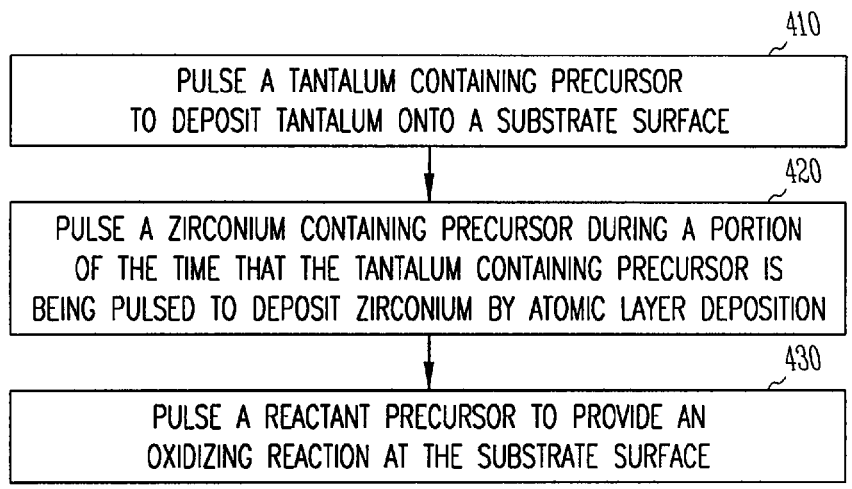
FIG. 4 illustrates a flow diagram of elements for an embodiment of a method to form a dielectric layer containing a zirconium-doped tantalum oxide, according to the present invention.

FIG. 4 illustrates a flow diagram of elements for an embodiment of a method to form a dielectric layer containing a zirconium-doped tantalum oxide. At 410, a tantalum containing precursor is pulsed to deposit tantalum onto a substrate surface. A number of precursors containing tantalum may be used to deposit the tantalum. At 420, a zirconium containing precursor is pulsed to deposit zirconium by atomic layer deposition. The zirconium containing precursor is pulsed during a portion of the time that the tantalum containing precursor is being pulsed. A number of precursors containing zirconium may be used to deposit the zirconium. At 430, a reaction precursor is pulsed. The reaction precursor provides an oxidizing reaction at the substrate surface to form $TaO_x$ doped with zirconium. The zirconium dopant may be $ZrO_x$.

In the embodiment of FIG. 4, the zirconium containing precursor can be pulsed simultaneously with the tantalum containing precursor. Then, following a gas purge, a reactant precursor that provides an ALD reaction for both the tantalum containing precursor and the zirconium precursor is pulsed into the reaction. The percentage of the zirconium can be controlled by regulating the percentage of the zirconium containing precursor in the precursor mixture that is injected into the reaction chamber to the substrate. The growth per cycle would then depend on the growth rate using the given mixture. As can be understood by those skilled in the art, determining the growth rate for a particular mixture can be determined during normal initial testing of the ALD system for processing a zirconium-doped $TaO_x$ dielectric film without undue experimentation.

Atomic layer deposition of the individual components of the zirconium-doped $TaO_x$ layer allows for individual control of each precursor pulsed into the reaction chamber. Thus, each precursor is pulsed into the reaction chamber for a predetermined period, where the predetermined period can be set separately for each precursor. Additionally, for various embodiments for ALD formation of a zirconium-doped $TaO_x$ layer, each precursor can be pulsed into the reaction under separate environmental conditions. The substrate can be maintained at a selected temperature and the reaction chamber maintained at a selected pressure independently for pulsing each precursor. Appropriate temperatures and pressures may be maintained, whether the precursor is a single precursor or a mixture of precursors. During atomic layer deposition, the pulsing of the precursor gases is separated by purging the reaction chamber with a purging gas following each pulsing of a precursor. In an embodiment, nitrogen gas is used as the purging gas following the pulsing of each precursor used in a cycle to form a film of zirconium-doped $TaO_x$. Additionally, the reaction chamber can also be purged by evacuating the reaction chamber.

Figure 5:
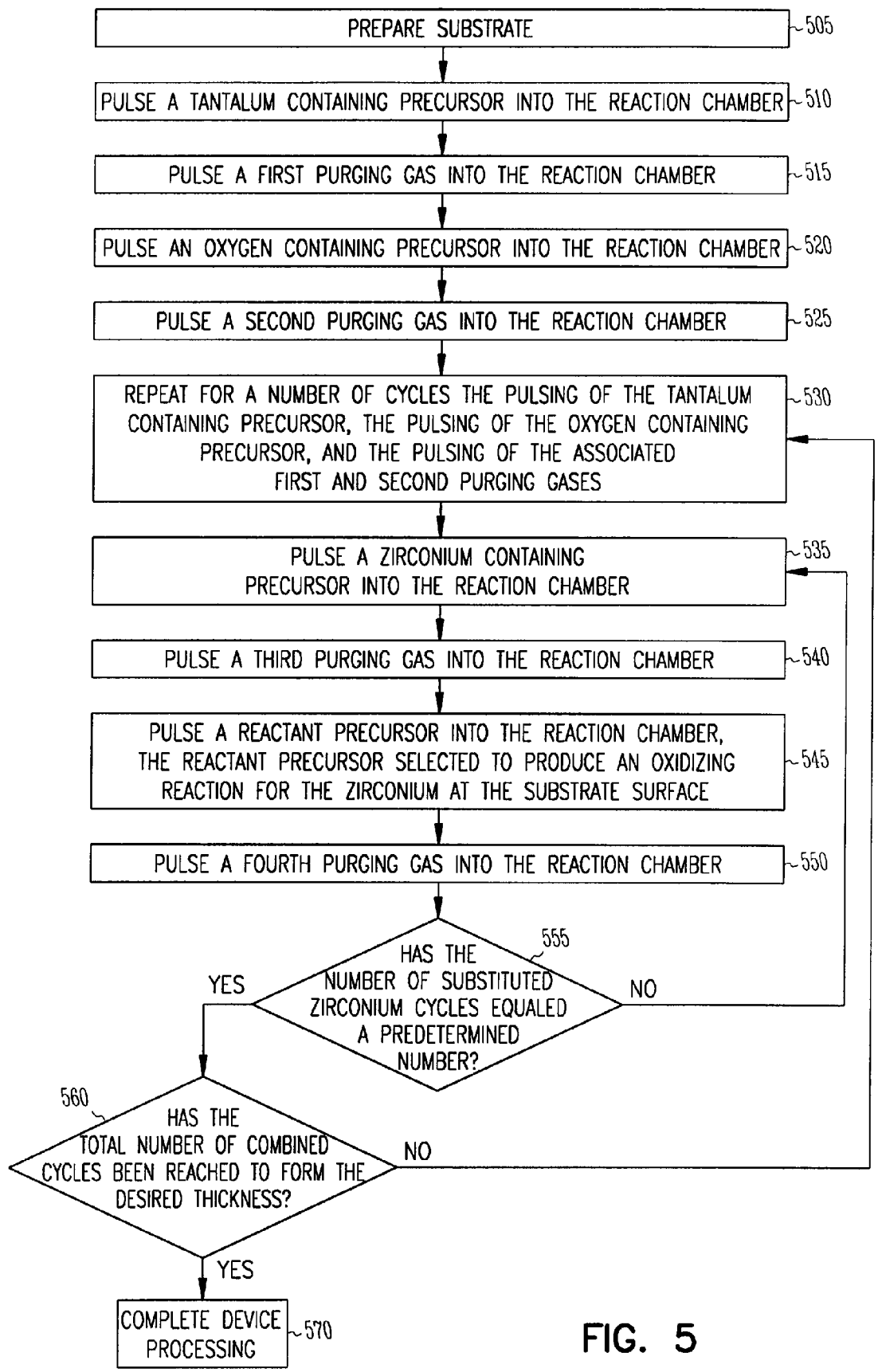
FIG. 5 illustrates a flow diagram of elements for an embodiment of a method to form a dielectric layer containing a zirconium-doped tantalum oxide including substituting a zirconium sequence for a tantalum sequence, according to the present invention.

FIG. 5 illustrates a flow diagram of elements for an embodiment of a method to form a dielectric layer containing a zirconium-doped tantalum oxide including substituting a zirconium sequence for a tantalum sequence. This embodiment can be implemented with the atomic layer deposition system 100 of FIG. 1. At 505, a substrate 110 is prepared. The substrate used for forming a transistor is typically a silicon or silicon containing material. In other embodiments, germanium, gallium arsenide, silicon-on-sapphire substrates, or other suitable substrates may be used. This preparation process includes cleaning substrate 110 and forming layers and regions of the substrate, such as drains and sources of a metal oxide semiconductor (MOS) transistor, prior to forming a gate dielectric. In an embodiment, the substrate is cleaned to provide an initial substrate depleted of its native oxide. In an embodiment, the initial substrate is cleaned to also provide a hydrogen-terminated surface. In an embodiment, a silicon substrate undergoes a final HF rinse prior to ALD processing to provide the silicon substrate with a hydrogen-terminated surface without a native silicon oxide layer.

The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 110 in its ready for processing form is conveyed into a position in reaction chamber 120 for ALD processing.

At 510, a tantalum containing precursor is pulsed into reaction chamber 120. In an embodiment, $Ta(OC_2H_5)_5$ is used as a precursor. The $Ta(OC_2H_5)_5$ is pulsed into reaction chamber 120 through the gas-distribution fixture 140 onto substrate 110. The flow of the $Ta(OC_2H_5)_5$ is controlled by mass-flow controller 156 from gas source 151, where the $Ta(OC_2H_5)_5$ is maintained at about 105° C. The pressure in reaction chamber is at about 10 mbar nitrogen pressure. In another embodiment, the substrate temperature is maintained between about 250° C. and about 325° C. by heating element 130. The upper bound of 325° C. is the highest temperature for $Ta_2O_5$ to form in the self-controlled growth regime. The $Ta(OC_2H_5)_5$ reacts with the surface of the substrate 110 in the desired region defined by the unmasked areas of the substrate 110. In other embodiments, a tantalum containing precursor includes $TaCl_5$.

At 515, a first purging gas is pulsed into the reaction chamber 120. In particular, nitrogen is used as a purging gas and a carrier gas. The nitrogen flow is controlled by mass-flow controller 166 from the purging gas source 161 into the gas conduit 170. Using the pure nitrogen purge avoids overlap of the precursor pulses and possible gas phase reactions. Following the purge, an oxygen containing precursor is pulsed into the reaction chamber 120, at 520.

For the tantalum sequence using a $Ta(OC_2H_5)_5$ or $TaCl_5$ as the precursor, water vapor is selected as the precursor acting as a reactant to form $TaO_x$ on the substrate 110. The $H_2O$ vapor is pulsed into the reaction chamber 120 through gas conduit 170 from gas source 152 by mass-flow controller 157. The water vapor aggressively reacts at the surface of substrate 110.

Following the pulsing of an oxygen containing precursor, a second purging gas is injected into the reaction chamber 120, at 525. Nitrogen gas is used to purge the reaction chamber after pulsing each precursor gas in the tantalum/oxygen sequence. Excess precursor gas, and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

At 530, the pulsing of the tantalum containing precursor, the pulsing of the oxygen containing precursor, and the pulsing of the first and second purging gas are repeated for a number of cycles. After repeating the tantalum/oxygen sequence for a selected number of cycles, a zirconium containing precursor is pulsed into the reaction chamber 120, at 535.

In an embodiment, $ZrI_4$ is used as the zirconium containing precursor. Alternately, $ZrCl_4$ may be used as the zirconium containing precursor. The $ZrI_4$ precursor having a purity of about 99.5% or greater is evaporated from a containment area held at about 240° C. in gas source 152. Mass-flow controller 158 regulates the pulsing of the $ZrI_4$ precursor to the surface of the substrate 110 through gas-distribution fixture 140 from gas source 152. In an embodiment, the substrate temperature is maintained between about 230° C. and about 500° C. by heating element 130.

At 540, a third purging gas is introduced into the system. Nitrogen gas can also be used as a purging and carrier gas. The nitrogen flow is controlled by mass-flow controller 167 from the purging gas source 162 into the gas conduit 170 and subsequently into the reaction chamber 120. In another embodiment, argon gas is used as the purging gas. Following the pulsing of the third purging gas, a reactant precursor is pulsed into the reaction chamber 120, at 545. The reactant precursor is selected to produce an oxidizing reaction for the zirconium at the substrate surface. In an embodiment, the reactant precursor is $H_2O$-$H_2O_2$ vapor. Mass-flow controller 159 regulates the $H_2O$-$H_2O_2$ vapor pulsing into reaction chamber 120 through gas conduit 170 from gas source 153. The $H_2O$-$H_2O_2$ vapor aggressively reacts at the surface of substrate 110.

Following the pulsing of the reactant precursor, a fourth purging gas is injected into reaction chamber 120, at 550. Nitrogen gas may be used to purge the reaction chamber after pulsing each precursor gas in the zirconium/oxygen sequence. In another embodiment, argon gas may be used as the purging gas. Excess precursor gas, and reaction by-products are removed from the system by the purge gas in conjunction with the exhausting of reaction chamber 120 using vacuum pump 182 through mass-flow controller 187, and exhausting of the gas conduit 170 by the vacuum pump 181 through mass-flow controller 186.

During a $ZrI_4$/$H_2O$-$H_2O_2$ vapor sequence, the substrate is held between about 230° C. and about 500° C. by the heating element 130 with reaction chamber 120 held at about 250 Pa. In an embodiment, the $ZrI_4$ pulse time is about 2.0 sec. After the $ZrI_4$ pulse, the zirconium sequence continues with a purge pulse followed by a $H_2O$-$H_2O_2$ vapor pulse followed by a purge pulse. In an embodiment, the $H_2O$-$H_2O_2$ vapor pulse time is about 2.0 sec, and the $ZrI_4$ and the $H_2O$-$H_2O_2$ vapor purging pulse times are each at about 2.0 sec.

At 555, a determination is made as to whether the number of substituted zirconium cycles has equaled a predetermined number. The predetermined number of substitution cycles is selected to set the percentage of zirconium dopant in the $TaO_x$ film. In an embodiment, the percentage is set ranging from about 5% to about 40% zirconium in the zirconium-doped $TaO_x$ film with respect to an atomic ratio of zirconium atoms to the sum of zirconium and tantalum atoms. If the number of completed substitution cycles is less than the predetermined number, the zirconium containing precursor is pulsed into the reaction chamber, at 535, and the process continues. If the number of completed substitution cycles equals the predetermined number, then a determination is made as to whether a total number of combined cycles has been completed to form a desired thickness, at 560. If the total number of cycles to form the desired thickness has not been completed, a number of cycles for the tantalum/oxygen sequence is repeated, at 530, and the process continues. If the total number of cycles to form the desired thickness has been completed, the dielectric film containing zirconium-doped $TaO_x$ may optionally be annealed. The zirconium-doped $TaO_x$ film processed at these relatively low temperatures may provide an amorphous layer.

The thickness of a zirconium-doped $TaO_x$ film is determined by a fixed growth rate for the pulsing periods and precursors used, set at a value such as N nm/combined cycle, dependent upon the number of cycles of the zirconium sequence relative to the tantalum sequence that form a combined sequence. For a desired zirconium-doped $TaO_x$ film thickness, t, in an application such as forming a gate dielectric of a MOS transistor, the ALD process is repeated for t/N total combined cycles. Once the t/N cycles have completed, no further ALD processing for zirconium-doped $TaO_x$ is required.

In various embodiments, the presence of residual chlorine in a zirconium-doped $TaO_x$ dielectric film may be reduced or eliminated providing a substantially chlorine free film by using metal precursors other than metal chlorides in the ALD processing of each metal, tantalum and zirconium. Use of a metal iodine as a precursor results in a film substantially free of residual iodine. As a result, metal halide precursors other than chloride metal precursors may be used. Eliminating residual chloride in such dielectric films may provide reduced leakage current for devices having these dielectric films.

At 570, after forming the zirconium-doped $TaO_x$, processing the device having the dielectric layer containing zirconium-doped $TaO_x$ is completed. In an embodiment, completing the device includes completing the formation of a transistor. In another embodiment, completing the device includes completing the formation of a capacitor. Alternately, completing the process includes completing the construction of a memory device having an array with access transistors formed with gate dielectrics containing atomic layer deposited zirconium-doped $TaO_x$. Further, in another embodiment, completing the process includes the formation of an electronic system including an information handling device that uses electronic devices with transistors formed with dielectric films containing atomic layer deposited zirconium-doped $TaO_x$. Typically, information handling devices such as computers include many memory devices, having many access transistors.

It can appreciated by those skilled in the art that the elements of a method for forming an atomic layer deposited zirconium-doped $TaO_x$ film in the embodiment of FIG. 5 can be performed with various number of cycles for the tantalum sequence and various number of cycles for the zirconium dopant sequence. In an embodiment, substituting a zirconium cycle for one or more cycles includes substituting a number of zirconium cycles to form a dielectric layer containing $TaO_x$ doped with a predetermined percentage (atomic ratio) for the zirconium ranging from about 5% to about 40% zirconium. In another embodiment, the ALD processing of a zirconium-doped $TaO_x$ dielectric film may provide a dielectric film having a dielectric constant ranging from about 8 to about 27 depending upon the existence of an interface layer at the surface of the silicon surface.

Figure 6:
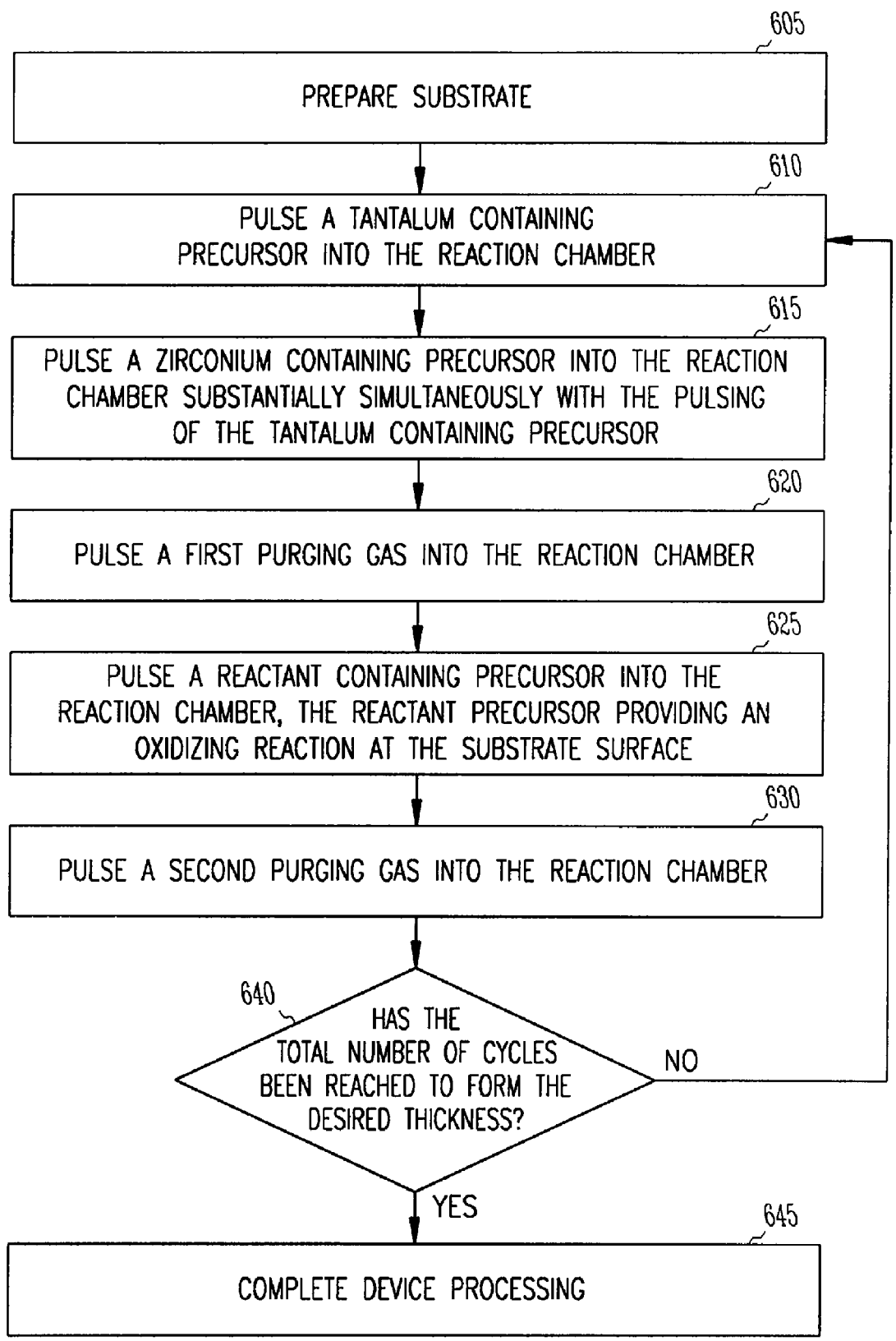
FIG. 6 illustrates a flow diagram of elements for an embodiment of a method to form a dielectric layer containing a zirconium-doped tantalum oxide including commonly pulsing a zirconium precursor and a tantalum precursor, according to the present invention.

FIG. 6 illustrates a flow diagram of elements for an embodiment of a method to form a dielectric layer containing a zirconium-doped tantalum oxide including commonly pulsing a zirconium precursor and a tantalum precursor. This embodiment can be implemented with the atomic layer deposition system 100 of FIG. 1. At 605, a substrate 110 is prepared in a similar manner has at 505 in FIG. 5. Then, a tantalum containing precursor is pulsed into reaction chamber 120, at 610. A zirconium containing precursor is pulsed into reaction chamber 120 substantially simultaneously with the pulsing of the tantalum containing precursor, at 615. Though the zirconium containing precursor is pulsed with the tantalum precursor, the period for the zirconium containing precursor may be less than the period for the tantalum containing precursor. The mixture of the zirconium containing precursor and the tantalum containing precursor is regulated such that the zirconium acts as a dopant in a dielectric film containing the tantalum. After pulsing the tantalum containing precursor and the zirconium containing precursor, a first purging gas is pulsed into reaction chamber 120, at 620. Excess precursor gases and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

A reactant containing precursor is pulsed into reaction chamber 120, at 625. The reactant containing precursor provides an oxidizing reaction at substrate 110. A second purging gas is pulsed into reaction chamber 120, at 630. Completing the pulsing of the second purging gas into reaction chamber 120 completes one cycle for a tantalum-zirconium dopant sequence. Then, it is determined whether the total number of cycles for the tantalum-zirconium dopant sequence has been reached to form the desired thickness for a dielectric film containing zirconium-doped $TaO_x$, at 640.

If the total number of cycles to form the desired thickness has not been completed, the tantalum containing precursor is pulsed into reaction chamber, at 610, and the process continues. If the total number of cycles to form the desired thickness has been completed, the dielectric film containing zirconium-doped $TaO_x$ can be annealed. The zirconium-doped $TaO_x$ formed is amorphous and remains amorphous after annealing.

The thickness of a zirconium-doped $TaO_x$ film is determined by a fixed growth rate for the pulsing periods and precursors used, set at a value such as N nm/cycle, dependent upon the tantalum precursor/zirconium dopant precursor mixture used. For a desired zirconium-doped $TaO_x$ film thickness, t, in an application such as forming a gate dielectric of a MOS transistor, the ALD process is repeated for t/N total cycles. Once the t/N cycles have completed, no further ALD processing for zirconium-doped $TaO_x$ is required. After forming the zirconium-doped $TaO_x$, processing the device having the dielectric layer containing zirconium-doped $TaO_x$ is completed, at 645, in a similar manner as for 570 of FIG. 5.

It can appreciated by those skilled in the art that the elements of a method for forming an atomic layer deposited zirconium-doped $TaO_x$ film in the embodiment of FIG. 6 can be performed with various percentages for the zirconium containing precursor in the precursor mixture. In an embodiment, pulsing a zirconium containing precursor into the reaction chamber includes regulating the percentage of the zirconium containing precursor relative to the tantalum containing precursor to form a dielectric layer containing $TaO_x$ doped with a predetermined percentage of the zirconium. In another embodiment, the zirconium-doped $TaO_x$ layer may be amorphous. The atomic ratio of zirconium to the sum of zirconium and tantalum atoms may be regulated to select a dielectric constant in the range from about 8 to about 27. The selection of the dielectric constant may be conducted in a optimization, or trade-off, process with improving the current leakage characteristics of the film.

The embodiments described herein provide a process for growing a dielectric film having a wide range of useful equivalent oxide thickness, $t_{eq}$, associated with a dielectric constant in the range from about 8 to about 27. This range of dielectric constants provides for a $t_{eq}$ ranging from about 14% to about 48% of a given silicon dioxide thickness. Alternately, for an acceptable silicon dioxide thickness, an embodiment for a zirconium-doped tantalum oxide may be from two to seven times larger than the acceptable silicon dioxide thickness providing enhanced probability for reducing leakage current. Further, dielectric films of zirconium-doped $TaO_x$ formed by atomic layer deposition can provide not only thin $t_{eq}$ films, but also films with relatively low leakage current. Doping with zirconium yields a doped amorphous $TaO_x$ with enhanced leakage current characteristics. Additionally, the novel process can be implemented to form transistors, capacitors, memory devices, and other electronic systems including information handling devices.

Figure 7:
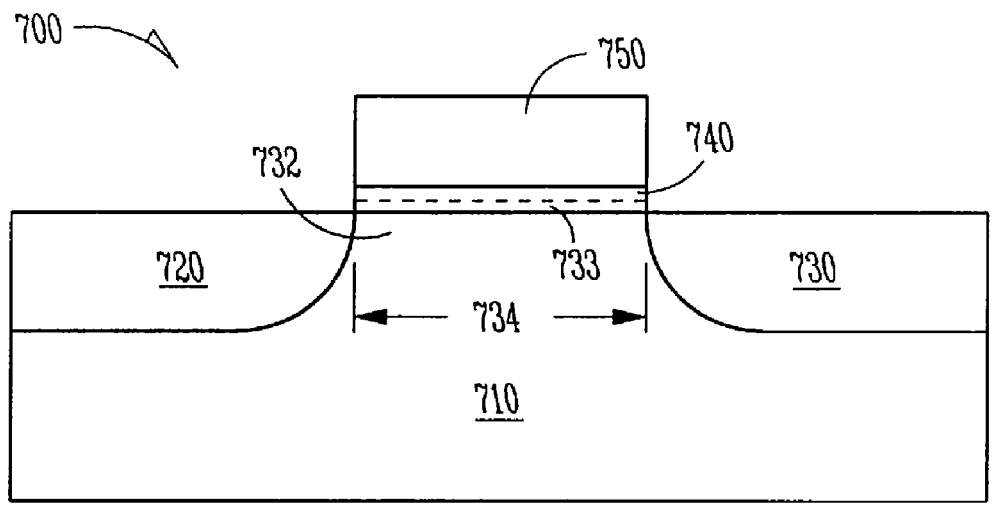
FIG. 7 shows an embodiment of a configuration of a transistor having a dielectric layer containing an atomic layer deposited zirconium-doped tantalum oxide, according to the present invention.

A transistor 700 as depicted in FIG. 7 may be constructed by forming a source region 720 and a drain region 730 in a silicon based substrate 710 where source and drain regions 720, 730 are separated by a body region 732. Body region 732 defines a channel having a channel length 734. A dielectric layer is disposed on substrate 710 formed as a layer containing zirconium-doped tantalum oxide on substrate 710 in a reaction chamber by atomic layer deposition. The resulting dielectric layer forms gate dielectric 740.

A gate 750 is formed over gate dielectric 740. Typically, forming gate 750 may include forming a polysilicon layer, though a metal gate may be formed in an alternative process. An interfacial layer 733 may form between body region 732 and gate dielectric 740. In an embodiment, interfacial layer 733 may be limited to a relatively small thickness compared to gate dielectric 740, or to a thickness significantly less than gate dielectric 740 as to be effectively eliminated. Forming the substrate, the source and drain regions, and the gate is performed using standard processes known to those skilled in the art. Additionally, the sequencing of the various elements of the process for forming a transistor is conducted with standard fabrication processes, also as known to those skilled in the art. In an embodiment, gate dielectric 740 may be realized as a gate insulator in a silicon CMOS transistor. Use of a gate dielectric containing zirconium-doped tantalum oxide is not limited to silicon based substrates, but may be used with a variety of semiconductor substrates.

Figure 8:
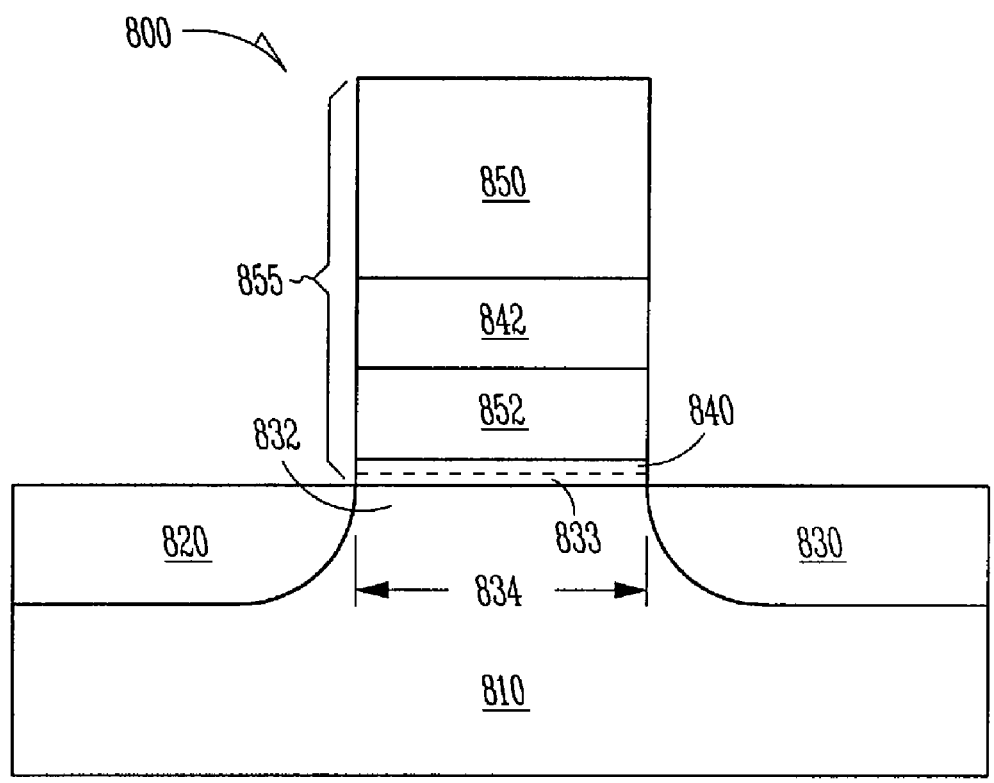
FIG. 8 shows an embodiment of a configuration of a transistor with a floating gate having a dielectric layer containing an atomic layer deposited zirconium-doped tantalum oxide, according to the present invention.

FIG. 8 shows an embodiment of a configuration of a transistor 800 having an atomic layer deposited zirconium-doped $TaO_x$ dielectric film. Transistor 800 includes a silicon based substrate 810 with a source 820 and a drain 830 separated by a body region 832. Body region 832 between source 820 and drain 830 defines a channel region having a channel length 834. Located above body region 832 is a stack 855 including a gate dielectric 840, a floating gate 852, a floating gate dielectric 842, and a control gate 850. Gate dielectric 840 includes a dielectric containing an atomic layer deposited zirconium-doped $TaO_x$ dielectric film as described herein with the remaining elements of the transistor 800 formed using processes known to those skilled in the art. Alternately, both gate dielectric 840 and floating gate dielectric 842 may be formed as dielectric layers containing an atomic layer deposited zirconium-doped $TaO_x$ dielectric film in various embodiments as described herein. An interfacial layer 833 may form between body region 832 and gate dielectric 840. In an embodiment, interfacial layer 833 may be limited to a relatively small thickness compared to gate dielectric 840, or to a thickness significantly less than gate dielectric 840 as to be effectively eliminated. In an embodiment, gate dielectric 840 forms a tunnel gate insulator and floating gate dielectric 842 forms an inter-gate insulator in flash memory devices, where gate dielectric 840 and/or floating gate dielectric 842 have an atomic layer deposited zirconium-doped tantalum oxide film. Use of a gate dielectric and/or floating gate dielectric containing an atomic layer deposited zirconium-doped tantalum oxide is not limited to silicon based substrates, but may be used with a variety of semiconductor substrates.

Figure 9:
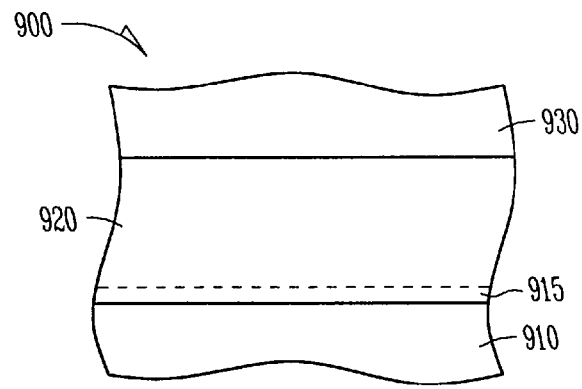
FIG. 9 shows an embodiment of a configuration of a capacitor having a dielectric layer containing an atomic layer deposited zirconium-doped tantalum oxide, according to the present invention.

The embodiments of methods for forming dielectric layers containing an atomic layer deposited zirconium-doped $TaO_x$ dielectric film may also be applied to forming capacitors in various integrated circuits, memory devices, and electronic systems. In an embodiment for forming a capacitor 900 illustrated in FIG. 9, a method includes forming a first conductive layer 910, forming a dielectric layer 920 containing an atomic layer deposited zirconium-doped $TaO_x$ film on first conductive layer 910, and forming a second conductive layer 930 on dielectric layer 920. The dielectric layer containing zirconium-doped $TaO_x$ may be formed using any of the embodiments described herein. ALD formation of the zirconium-doped $TaO_x$ film allows the zirconium to be selectively doped into the $TaO_x$ film within a predetermined range for the percentage of the zirconium in the film. An interfacial layer 915 may form between first conductive layer 910 and dielectric layer 920. In an embodiment, interfacial layer 915 may be limited to a relatively small thickness compared to dielectric layer 920, or to a thickness significantly less than dielectric layer 920 as to be effectively eliminated. Embodiments for dielectric layer 920 containing an atomic layer deposited zirconium-doped $TaO_x$ in a capacitor includes, but is not limited to, dielectrics in DRAM capacitors and as dielectrics in capacitors in analog, radio frequency (RF), and mixed signal integrated circuits.

Various embodiments for a dielectric film containing atomic layer deposited zirconium-doped tantalum oxide provide for enhanced device performance by providing devices with reduced leakage current. Further improvements in leakage current characteristics may be attained by forming one or more layers of an atomic layer deposited zirconium-doped tantalum oxide in a nanolaminate structure with other metal oxides such as $TaO_x$ and $ZrO_x$. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range. Further, each individual material layer of the nanolaminate can have a thickness as low as a monolayer of the material or as high as 20 nanometers. A $TaO_x/ZrO_x$/zirconium-doped $TaO_x$ nanolaminate contains alternating layers of $TaO_x$ and $ZrO_x$ and zirconium-doped $TaO_x$.

Figure 10:
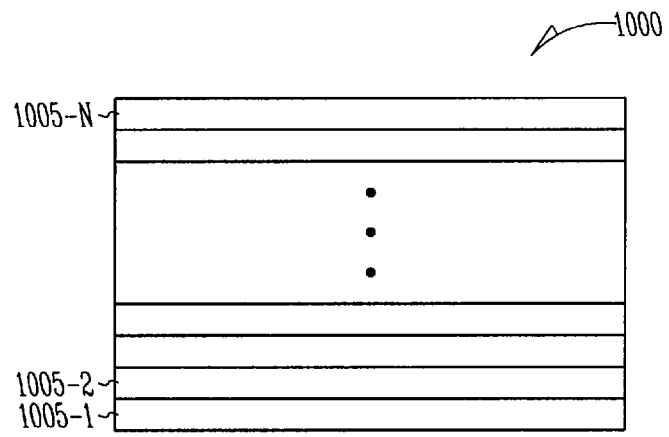
FIG. 10 depicts an embodiment of a dielectric layer including a nanolaminate having at least one layer containing an atomic layer deposited zirconium-doped tantalum oxide, according to the present invention.

FIG. 10 depicts a nanolaminate structure 1000 for an embodiment of a dielectric structure including an atomic layer deposited zirconium-doped $TaO_x$ dielectric film. Nanolaminate structure 1000 includes a plurality of layers 1005-1, 1005-2 to 1005-N, where at least one layer contains an atomic layer deposited zirconium-doped $TaO_x$ dielectric film. The other layers may be other metal oxides such as $TaO_x$ and $ZrO_x$. The sequencing of the layers depends on the application. The effective dielectric constant associated with nanolaminate structure 1000 is that attributable to N capacitors in series, where each capacitor has a thickness defined by the thickness of the corresponding layer. By selecting each thickness and the composition of each a nanolaminate structure can be engineered to have a predetermined dielectric constant. Embodiments for structures such as nanolaminate structure 1000 may be used as nanolaminate dielectrics in NROM flash memory devices as well as other integrated circuits.

Transistors, capacitors, and other devices having dielectric films containing atomic layer deposited zirconium-doped $TaO_x$ formed by the methods described above may be implemented into memory devices and electronic systems including information handling devices. Embodiments of these information handling devices may include wireless systems, telecommunication systems, and computers. Further, embodiments of electronic devices having dielectric films containing atomic layer deposited zirconium-doped tantalum oxide may be realized as integrated circuits.

Figure 11:
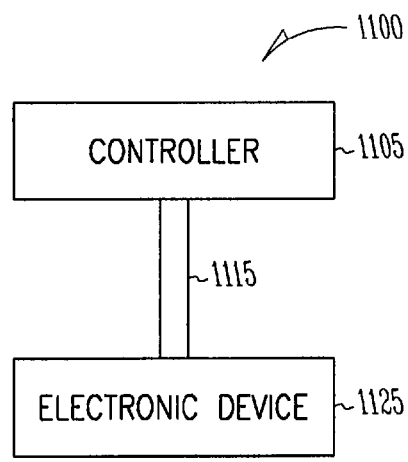
FIG. 11 is a simplified diagram for an embodiment of a controller coupled to an electronic device, according to the present invention.

FIG. 11 illustrates a diagram for an electronic system 1100 having one or more devices with an embodiment for a dielectric layer containing atomic layer deposited zirconium-doped TaO$_x$. Electronic system 1100 includes a controller 1105, a bus 1115, and an electronic device 1125, where bus 1115 provides electrical conductivity between controller 1105 and electronic device 1125. In various embodiments, controller 1005 and/or electronic device 1125 include an embodiment for a dielectric layer containing atomic layer deposited zirconium-doped TaO$_x$ as previously discussed herein. Electronic system 1100 may include, but is not limited to, information handling devices, wireless systems, telecommunication systems, fiber optic systems, electro-optic systems, and computers.

Figure 12:
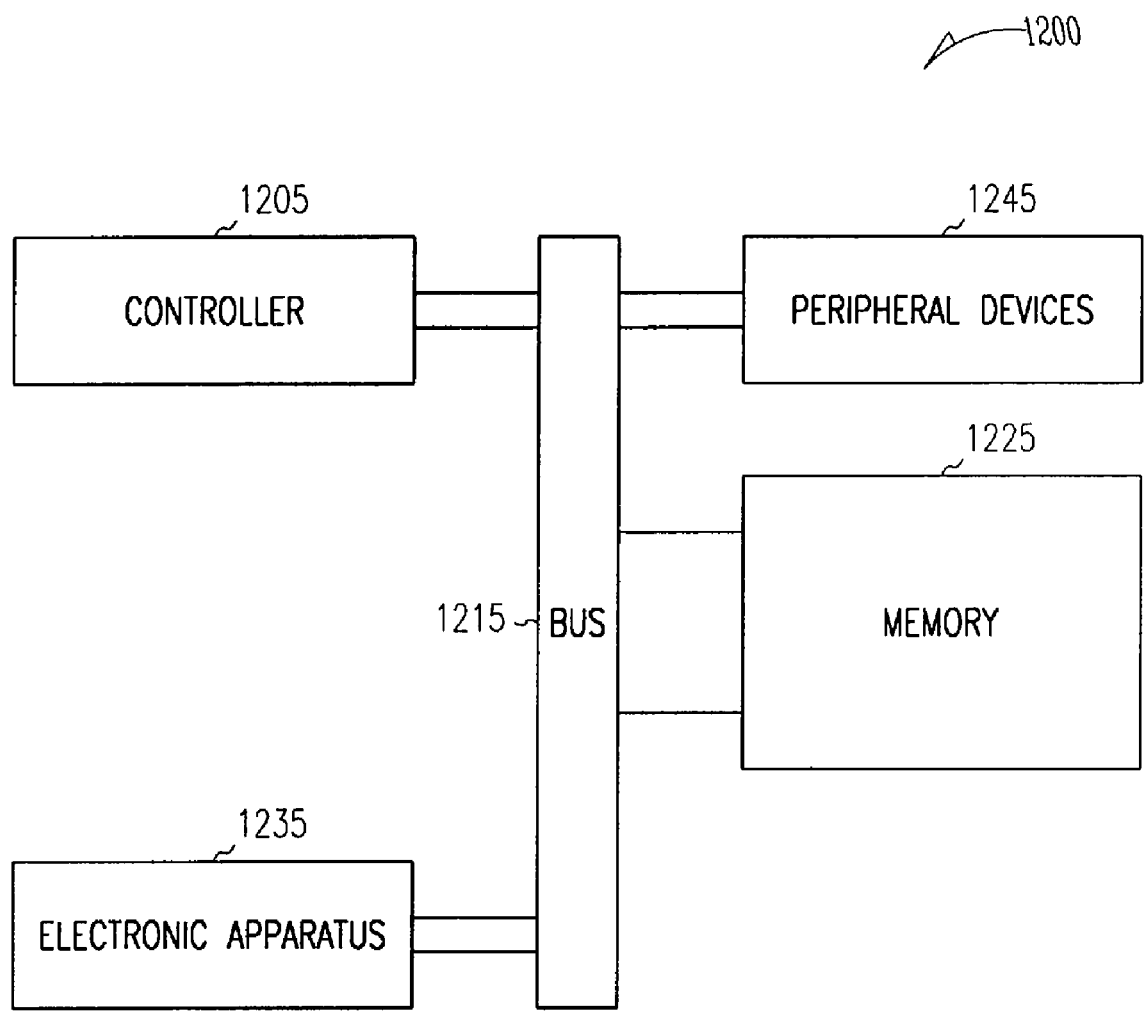
FIG. 12 illustrates a diagram for an embodiment of an electronic system having devices with a dielectric film containing an atomic layer deposited zirconium-doped tantalum oxide, according to the present invention.

FIG. 12 depicts a diagram of an embodiment of a system 1200 having a controller 1205 and a memory 1225. Controller 1205 and/or memory 1225 may include a dielectric layer having an atomic layer deposited zirconium-doped TaO$_x$. System 1200 also includes an electronic apparatus 1235, and a bus 1215, where bus 1215 provides electrical conductivity between controller 1205 and electronic apparatus 1235, and between controller 1205 and memory 1225. Bus 1215 may include an address, a data bus, and a control bus, each independently configured. Alternately, bus 1215 may use common conductive lines for providing address, data, and/or control, the use of which is regulated by controller 1205. In an embodiment, electronic apparatus 1235 may be additional memory configured similar as memory 1225. An embodiment may include an additional peripheral device or devices 1245 coupled to bus 1215. In an embodiment controller 1205 is a processor. Any of controller 1205, memory 1225, bus 1215, electronic apparatus 1235, and peripheral device devices 1245 may include a dielectric layer having an atomic layer deposited zirconium-doped TaO$_x$. System 1200 may include, but is not limited to, information handling devices, telecommunication systems, and computers.

Peripheral devices 1245 may include displays, additional storage memory, or other control devices that may operate in conjunction with controller 1205. Alternately, peripheral devices 1245 may include displays, additional storage memory, or other control devices that may operate in conjunction with controller 1205 and/or memory 1225.

Memory 1225 may be realized as a memory device containing an atomic layer deposited zirconium-doped TaO$_x$ dielectric layer. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Zirconium-doped tantalum oxide films formed by atomic layer deposition processed in relatively low temperatures can be amorphous and possess smooth surfaces. Such zirconium-doped tantalum oxide films can provide enhanced electrical properties due to their smoother surface resulting in reduced leakage current. Additionally, zirconium-doped tantalum oxide films by atomic layer deposition may also provide reduced leakage current while providing an increased dielectric constant as compared with undoped tantalum oxide and pure zirconium oxide layers. Additionally, such dielectric layers provide a significantly thicker physical thickness than a silicon oxide layer having the same equivalent oxide thickness, where the increased thickness would also reduce leakage current. These properties of layers containing atomic layer deposited zirconium-doped tantalum oxide films allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited zirconium-doped tantalum oxide are formed having a dielectric constant (κ) substantially higher than that of silicon oxide, such that these dielectric films are capable of a $t_{eq}$ thinner than SiO$_2$ gate dielectrics of the same physical thickness. Alternately, the high dielectric constant relative to silicon dioxide allows the use of much larger physical thickness of these high-κ dielectric materials for the same $t_{eq}$ of SiO$_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
   providing a controller;
   coupling an integrated circuit to the controller, wherein the integrated circuit includes a dielectric film containing a zirconium-doped tantalum oxide, the zirconium-doped tantalum oxide formed by structuring one or more monolayers, wherein the zirconium-doped tantalum oxide is formed by:
   providing tantalum onto a substrate;
   providing zirconium onto the substrate; and
   controlling the provision of the tantalum and zirconium to form the zirconium-doped tantalum oxide by monolayer or partial monolayer sequencing.

2. The method of claim 1, wherein providing zirconium includes regulating the provision of the zirconium relative to the tantalum provided to form the dielectric layer containing the tantalum oxide doped with a percentage of the zirconium being about 5%.

3. The method of claim 1, wherein providing a controller includes providing a processor.

4. The method of claim 1, wherein coupling an integrated circuit to the controller includes coupling a mixed signal integrated circuit formed as the integrated circuit having a dielectric film containing a zirconium-doped tantalum oxide.

5. The method of claim 1, wherein providing tantalum includes providing the tantalum by atomic layer deposition including pulsing a tantalum halide precursor and providing zirconium includes providing the zirconium by atomic layer deposition including pulsing a zirconium halide precursor.

6. A method comprising:
   providing a controller;
   coupling a memory device to the controller, the memory device structured as an integrated circuit, wherein the memory device includes a dielectric film containing a zirconium-doped tantalum oxide, the zirconium-doped tantalum oxide formed by structuring one or more monolayers, wherein the zirconium-doped tantalum oxide is formed by:

providing tantalum onto a substrate;

providing zirconium onto the substrate; and controlling the provision of the tantalum and zirconium to form the zirconium-doped tantalum oxide by monolayer or partial monolayer sequencing.

7. The method of claim 6, wherein the method includes forming the zirconium-doped tantalum oxide as tantalum oxide doped with elemental zirconium.

8. The method of claim 6, wherein the method includes forming the zirconium-doped tantalum oxide as tantalum oxide doped with zirconium oxide.

9. The method of claim 6, wherein providing zirconium includes providing zirconium by atomic layer deposition including pulsing a zirconium precursor while pulsing a tantalum precursor.

10. The method of claim 6, wherein providing zirconium includes providing the zirconium while providing the tantalum for a period of time that ends before the providing of tantalum ends.

11. A method comprising:

providing a processor;

coupling a memory device to the processor, the memory device structured as an integrated circuit, wherein the memory device includes a dielectric film containing a zirconium-doped tantalum oxide, the zirconium-doped tantalum oxide formed by atomic layer deposition including:

pulsing a tantalum-containing precursor to provide tantalum on a substrate;

pulsing an oxygen-containing precursor to provide oxygen to the substrate surface after pulsing the tantalum-containing precursor;

repeating for a plurality of cycles the pulsing of the tantalum containing precursor and the pulsing of the oxygen containing precursor; and substituting a zirconium cycle for one or more cycles of the pulsing of the tantalum-containing precursor, the zirconium cycle including pulsing a zirconium-containing precursor to provide zirconium to the substrate containing the tantalum and the oxygen.

12. The method of claim 11, wherein the method includes forming the dielectric film containing zirconium-doped tantalum oxide as a gate insulator of a transistor in the memory device.

13. The method of claim 11, wherein the method includes forming the memory device as a NROM flash memory and forming the dielectric layer as a nanolaminate in the NROM flash memory.

14. The method of claim 11, wherein the method includes forming an electro-optic system.

15. The method of claim 11, wherein the method includes forming a wireless system.

16. A method comprising:

providing a controller;

coupling an integrated circuit to the controller, wherein the integrated circuit includes a dielectric film containing a zirconium-doped tantalum oxide, the zirconium-doped tantalum oxide formed by atomic layer deposition including:

pulsing a tantalum-containing precursor to provide tantalum on a substrate;

pulsing an oxygen-containing precursor to provide oxygen to the substrate surface after pulsing the tantalum-containing precursor;

repeating for a plurality of cycles the pulsing of the tantalum containing precursor and the pulsing of the oxygen containing precursor; and substituting a zirconium cycle for one or more cycles of the pulsing of the tantalum-containing precursor, the zirconium cycle including pulsing a zirconium-containing precursor to provide zirconium to the substrate containing the tantalum and the oxygen.

17. The method of claim 16, wherein the method includes forming the dielectric film containing zirconium-doped tantalum oxide as a gate insulator in a silicon CMOS device in the integrated circuit.

18. The method of claim 16, wherein the method includes forming the dielectric film containing zirconium-doped tantalum oxide as a dielectric between two electrodes in a capacitor in the integrated circuit.

19. The method of claim 16, wherein the method includes forming the dielectric film containing zirconium-doped tantalum oxide as a tunnel gate insulator in a transistor in the integrated circuit.

20. The method of claim 16, wherein the method includes forming the dielectric film containing zirconium-doped tantalum oxide as an inter-gate insulator in a transistor.

21. A method comprising:

providing a controller;

coupling an integrated circuit to the controller, wherein the integrated circuit includes a dielectric film containing a zirconium-doped tantalum oxide, the zirconium-doped tantalum oxide formed by atomic layer deposition including:

pulsing a tantalum-containing precursor to provide tantalum to a substrate;

pulsing a zirconium containing precursor during a portion of time that the tantalum containing precursor is being pulsed to provide zirconium to the substrate; and pulsing a reactant precursor to provide an oxidizing reaction at the substrate, the reactant precursor pulsed after pulsing the tantalum containing precursor and the zirconium-containing precursor.

22. The method of claim 21, wherein the method includes regulating a ratio of the zirconium containing precursor to the tantalum containing precursor being pulsed during the portion of time to approximate a selected ratio of zirconium atoms to a sum of zirconium and tantalum atoms in the dielectric film.

23. The method of claim 21, wherein coupling an integrated circuit to the controller includes coupling a radio frequency circuit.

24. The method of claim 21, wherein the method includes forming a computer.

25. The method of claim 21, wherein the method includes forming a telecommunications system.

* * * * *